(12) United States Patent
Cheng et al.

(10) Patent No.: US 10,672,667 B2
(45) Date of Patent: *Jun. 2, 2020

(54) SEMICONDUCTOR DEVICE AND METHOD

(71) Applicant: Taiwan Semiconductor Manufacturing Company, Ltd., Hsinchu (TW)

(72) Inventors: Chao-Ching Cheng, Hsinchu (TW); Tzu-Chiang Chen, Hsinchu (TW); Chen-Feng Hsu, Hsinchu (TW); Yu-Lin Yang, Baoshan Township (TW); Tung Ying Lee, Hsinchu (TW); Chih Chieh Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/417,341

(22) Filed: May 20, 2019

(65) Prior Publication Data

US 2019/0279911 A1 Sep. 12, 2019

Related U.S. Application Data

(63) Continuation of application No. 15/864,793, filed on Jan. 8, 2018, now Pat. No. 10,297,508.

(Continued)

(51) Int. Cl.
*H01L 29/00* (2006.01)
*H01L 21/8238* (2006.01)
(Continued)

(52) U.S. Cl.
CPC ...... *H01L 21/823807* (2013.01); *B82Y 10/00* (2013.01); *H01L 21/02532* (2013.01); *H01L 21/02603* (2013.01); *H01L 21/30604* (2013.01); *H01L 21/823412* (2013.01); *H01L 21/823814* (2013.01); *H01L 27/092* (2013.01);
(Continued)

(58) Field of Classification Search
CPC .................................................. H01L 29/0673
See application file for complete search history.

(56) References Cited

U.S. PATENT DOCUMENTS 9,209,247 B2  12/2015  Colinge et al.
9,236,267 B2  1/2016  De et al.
(Continued)

FOREIGN PATENT DOCUMENTS

KR  20170090092 A  8/2017
KR  20170097322 A  8/2017
TW  20170067117 A  6/2017

*Primary Examiner* — Fernando L Toledo
*Assistant Examiner* — Valerie N Newton
(74) *Attorney, Agent, or Firm* — Slater Matsil, LLP

(57) ABSTRACT

Nanowire devices and fin devices are formed in a first region and a second region of a substrate. To form the devices, alternating layers of a first material and a second material are formed, inner spacers are formed adjacent to the layers of the first material, and then the layers of the first material are removed to form nanowires without removing the layers of the first material within the second region. Gate structures of gate dielectrics and gate electrodes are formed within the first region and the second region in order to form the nanowire devices in the first region and the fin devices in the second region.

20 Claims, 15 Drawing Sheets

Related U.S. Application Data

(60) Provisional application No. 62/552,737, filed on Aug. 31, 2017.

(51) Int. Cl.
- *H01L 27/092* (2006.01)
- *H01L 29/06* (2006.01)
- *H01L 29/423* (2006.01)
- *H01L 29/786* (2006.01)
- *H01L 29/66* (2006.01)
- *H01L 21/02* (2006.01)
- *H01L 21/306* (2006.01)
- *H01L 29/775* (2006.01)
- *H01L 29/08* (2006.01)
- *H01L 21/8234* (2006.01)
- *B82Y 10/00* (2011.01)

(52) U.S. Cl.
CPC ...... *H01L 29/0653* (2013.01); *H01L 29/0673* (2013.01); *H01L 29/0847* (2013.01); *H01L 29/42376* (2013.01); *H01L 29/42392* (2013.01); *H01L 29/66439* (2013.01); *H01L 29/66545* (2013.01); *H01L 29/66742* (2013.01); *H01L 29/66772* (2013.01); *H01L 29/775* (2013.01); *H01L 29/78651* (2013.01); *H01L 29/78654* (2013.01); *H01L 29/78684* (2013.01); *H01L 29/78696* (2013.01); *H01L 21/823456* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,590,089 B2 | 3/2017 | Rachmady et al. |
| 9,601,569 B1 | 3/2017 | Suk et al. |
| 9,608,116 B2 | 3/2017 | Ching et al. |
| 9,899,416 B2 | 2/2018 | Kim et al. |
| 10,008,575 B2 | 6/2018 | Suh et al. |
| 10,297,508 B2 * | 5/2019 | Cheng ............ H01L 21/823807 |
| 2011/0062417 A1 | 3/2011 | Iwayama et al. |

* cited by examiner

SEMICONDUCTOR DEVICE AND METHOD

PRIORITY CLAIM AND CROSS-REFERENCE

This application is a continuation of U.S. application Ser. No. 15/864,793, filed on Jan. 8, 2018 and entitled "Semiconductor Device and Method," which claims priority to and the benefit of U.S. Provisional Application No. 62/552,737, filed on Aug. 31, 2017, entitled "Semiconductor Device and Method," which applications are hereby incorporated herein by reference in their entireties.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
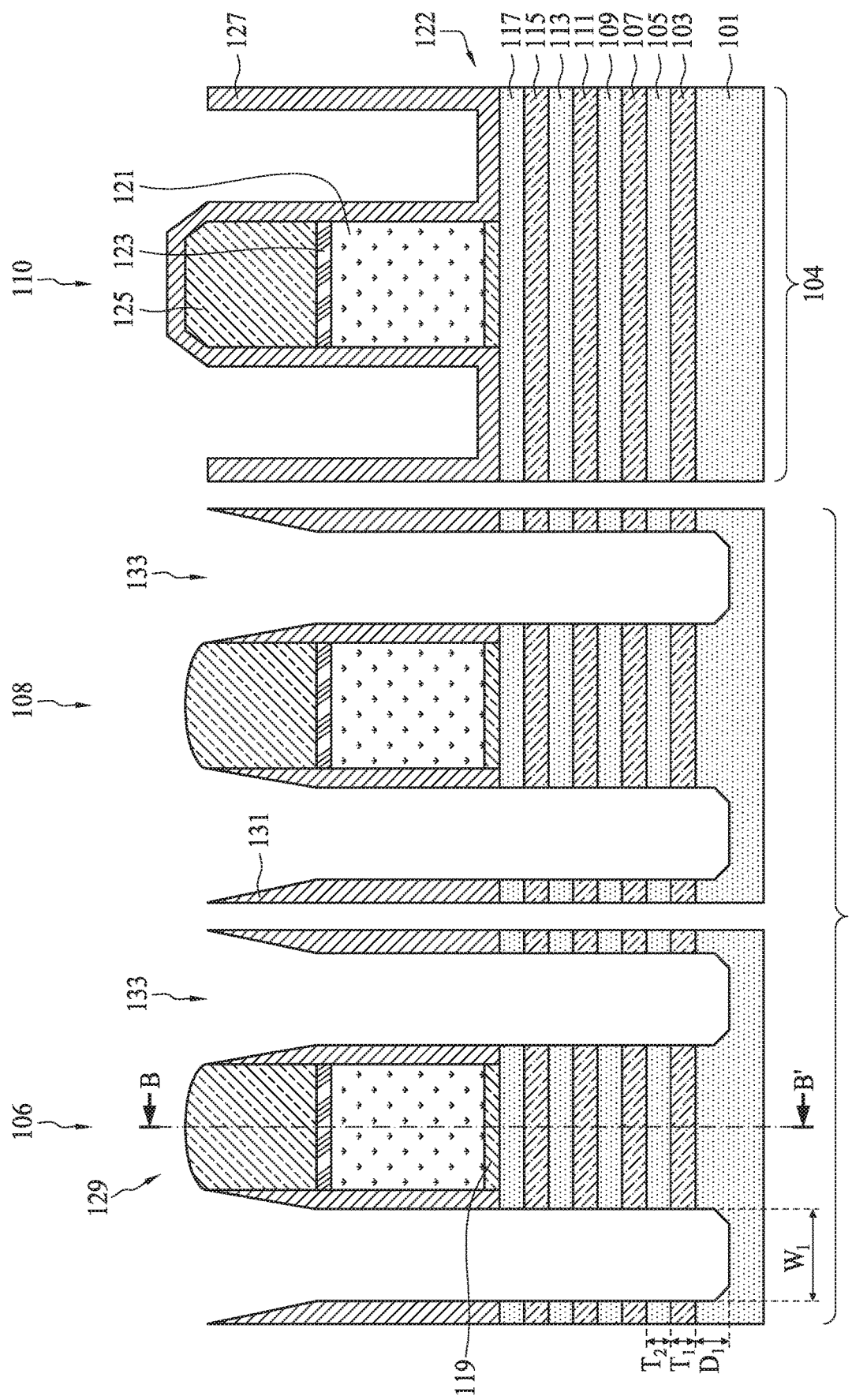
FIGS. 1A-1B illustrate a formation of alternating layers of a first semiconductor material and a second semiconductor material, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to the integration of short channel, horizontal gate-all-around nanowire transistors and long channel non-nanowire fin transistors for use in the design and operation of integrated circuits. Such embodiments help to avoid the performance degradation of long channel devices due to the problems associated with filling in limited spaces. Embodiments, however, may be utilized in a wide variety of ways, and are not intended to be limited to the embodiments described herein.

With reference now to FIG. 1, there is illustrated an embodiment in which a first semiconductor layer 103, a second semiconductor layer 105, a third semiconductor layer 107, a fourth semiconductor layer 109, a fifth semiconductor layer 111, a sixth semiconductor layer 113, a seventh semiconductor layer 115, and an eighth semiconductor layer 117 are formed over a semiconductor substrate 101. In an embodiment the semiconductor substrate 101 may be, for example, a silicon substrate, a silicon germanium substrate, a germanium substrate, a III-V material substrate, or a substrate formed of other semiconductor materials with, for example, high band-to-band tunneling (BTBT). In some embodiments, the semiconductor substrate 101 is a bulk substrate. In another embodiment, the semiconductor substrate 101 may be a Semiconductor-on-Insulator (SOI) substrate.

In an embodiment the semiconductor substrate 101 has a number of different regions within the semiconductor substrate 101. For example, in one embodiment the semiconductor substrate 101 has a core region 102 and an I/O region 104. Within the core region 102, a first device 106 and a second device 108 will be formed such that the first device 106 has an opposite conductivity than the second device 108. For example, in one embodiment the first device 106 may be an n-type device while the second device 108 may be a p-type device. However, any suitable combination of devices may be utilized.

Additionally, in the I/O region 104 a third device no may be formed. In an embodiment the third device 110 may be a finFET device formed to have a conductivity similar to the first device 106. For example, the third device 110 may be an n-type finFET, although in other embodiments the third device 110 may be a p-type finFET or the third device 110 may be representative of both an n-type device and a p-type device. Any suitable combination of devices may be utilized, and all such combinations are fully intended to be included within the scope of the embodiment. Further, while the first device 106, the second device 108, and the third device 110 are described at this stage of manufacture as "devices," this is not intended to imply that these devices are finished devices, but rather, that the structures within the identified devices will be used to form the ultimate finished devices.

The first semiconductor layer 103 is formed over the semiconductor substrate 101 in both the core region and the I/O region 104. In an embodiment the first semiconductor layer 103 is formed from a semiconductor material that can work with the semiconductor substrate 101 to help form either a fin 122 or first nanowires 901 and second nanowires 1001 (not illustrated in FIG. 1A but illustrated and described further below with respect to FIGS. 9 and 10). For example, the first semiconductor layer 103 may be formed from silicon germanium ($Si_xGe_{1-x}$, where x is in a range from about 0.01 to about 0.99), silicon, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

However, in order to help with the formation of the first nanowires 901 and the second nanowires 1001, the first semiconductor layer 103 is a different material from the semiconductor substrate 101 with a different etch selectivity. For example, in an embodiment in which the semiconductor substrate 101 is silicon, the first semiconductor layer 103 is formed of a material other than silicon, such as silicon germanium, silicon carbide, gallium arsenide, indium gallium arsenide, a III-V compound semiconductor, a II-VI compound semiconductor, or the like. However, any suitable combination can be utilized.

The first semiconductor layer 103 can be formed using a growth process such as epitaxial growth. For example, in one embodiment the material of the first semiconductor layer 103 may be grown from the exposed material of the semiconductor substrate 101. The growth process may be continued until the first semiconductor layer 103 has a first thickness $T_1$ of between about 5 nm and about 15 nm. However, any suitable process of formation and thickness may be utilized.

Once the first semiconductor layer 103 has been formed over the semiconductor substrate 101, the second semiconductor layer 105 may be formed over the first semiconductor layer 103. In an embodiment the second semiconductor layer 105 is formed from a semiconductor material that can work with the first semiconductor layer 103 and the semiconductor substrate 101 to help form either the fin 122 or the first nanowires 901 and second nanowires 1001. For example, the second semiconductor layer 105 may be formed from silicon, silicon germanium ($Si_xGe_{1-x}$, where x is in the range from about 0.01 to about 0.99), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

However, in order to help with the formation of the first nanowires 901 and the second nanowires 1001, the second semiconductor layer 105 is a different material from the first semiconductor layer 103 with a different etch selectivity. For example, in an embodiment in which the first semiconductor layer 103 is silicon germanium, the second semiconductor layer 105 is formed of the same material as the semiconductor substrate 101, such as by being silicon. However, the second semiconductor layer 105 may also be formed from a material different from both the first semiconductor layer 103 and the semiconductor substrate 101, and any suitable combination can be utilized.

The second semiconductor layer 105 can be formed using a growth process such as epitaxial growth. For example, in one embodiment the material of the second semiconductor layer 105 may be grown from the exposed material of the first semiconductor layer 103. The growth process may be continued until the second semiconductor layer 105 has a second thickness $T_2$ of between about 5 nm and about 15 nm, such as about 10 nm. However, any suitable process of formation and thickness may be utilized.

The third semiconductor layer 107 can be formed on the second semiconductor layer 105 using a material and process similar to the first semiconductor layer 103. For example, the third semiconductor layer 107 may be a material such as silicon germanium formed using an epitaxial growth process to a thickness of between about 5 nm and about 15 nm. However, any suitable process, material, and thickness may be utilized.

The fourth semiconductor layer 109 can be formed on the third semiconductor layer 107 using a material and process similar to the second semiconductor layer 105. For example, the fourth semiconductor layer 109 may be a material such as silicon formed using an epitaxial growth process to a thickness of between about 5 nm and about 15 nm. However, any suitable process, material, and thickness may be utilized.

The fifth semiconductor layer 111 can be formed on the fourth semiconductor layer 109 using a material and process similar to the first semiconductor layer 103. For example, the fifth semiconductor layer 111 may be a material such as silicon germanium formed using an epitaxial growth process to a thickness of between about 5 nm and about 15 nm. However, any suitable process, material, and thickness may be utilized.

The sixth semiconductor layer 113 can be formed on the fifth semiconductor layer 111 using a material and process similar to the second semiconductor layer 105. For example, the sixth semiconductor layer 113 may be a material such as silicon formed using an epitaxial growth process to a thickness of between about 5 nm and about 15 nm. However, any suitable process, material, and thickness may be utilized.

The seventh semiconductor layer 115 can be formed on the sixth semiconductor layer 113 using a material and process similar to the first semiconductor layer 103. For example, the seventh semiconductor layer 115 may be a material such as silicon germanium formed using an epitaxial growth process to a thickness of between about 5 nm and about 15 nm. However, any suitable process, material, and thickness may be utilized.

The eighth semiconductor layer 117 can be formed on the seventh semiconductor layer 115 using a material and process similar to the second semiconductor layer 105. For example, the eighth semiconductor layer 117 may be a material such as silicon formed using an epitaxial growth process to a thickness of between about 5 nm and about 15 nm. However, any suitable process, material, and thickness may be utilized.

By forming the first semiconductor layer 103, the second semiconductor layer 105, the third semiconductor layer 107, the fourth semiconductor layer 109, the fifth semiconductor layer 111, the sixth semiconductor layer 113, the seventh semiconductor layer 115, and the eighth semiconductor layer 117 over the semiconductor substrate 101, alternating layers of semiconductor material are formed, wherein layers of a first material (e.g., silicon) are formed between layers of a second material (e.g., silicon germanium). Such a stack of semiconductor materials may be used to form a fin 122 within the I/O region 104 and can also be utilized to form the first nanowires 901 and the second nanowires 1001 within the core region 102.

Once the first semiconductor layer 103, the second semiconductor layer 105, the third semiconductor layer 107, the fourth semiconductor layer 109, the fifth semiconductor layer 111, the sixth semiconductor layer 113, the seventh semiconductor layer 115, and the eighth semiconductor layer 117 have been formed over the semiconductor substrate 101, each of the first semiconductor layer 103, the second semiconductor layer 105, the third semiconductor layer 107, the fourth semiconductor layer 109, the fifth semiconductor layer 111, the sixth semiconductor layer 113, the seventh semiconductor layer 115, and the eighth semiconductor layer 117 and the semiconductor substrate 101 are patterned to form the fin 122. In an embodiment the layers can be patterned by applying a second photoresist (not separately illustrated in FIG. 1A) over the eighth semiconductor layer 117. The second photoresist is then patterned and developed to form a mask over the eighth semiconductor layer 117, and the mask is then used during an etching process, such as an anisotropic etching process to transfer the pattern of the second photoresist to the underlying layers and form the fin 122.

After the formation of the fin 122, first isolation regions 135 may be formed. In an embodiment the first isolation regions 135 may be shallow trench isolation regions formed by depositing a dielectric material such as an oxide material, a high-density plasma (HDP) oxide, or the like. The dielectric material may be formed, after an optional cleaning and lining, using either a chemical vapor deposition (CVD) method (e.g., the HARP process), a high density plasma CVD method, or other suitable method of formation.

Additionally, the dielectric material may be deposited to fill and overfill the spaces between the fins 122 with the dielectric material and then removing the excess material through a suitable process such as chemical mechanical polishing (CMP), an etch, a combination of these, or the like. In an embodiment, the removal process removes any dielectric material that is located over the fins 122 as well, so that the removal of the dielectric material will expose the surface of the fins 122 to further processing steps.

Once the dielectric material has been deposited, the dielectric material may then be recessed away from the surface of the fins 122. The recessing may be performed to expose at least a portion of the sidewalls of the fins 122 adjacent to the top surface of the fins 122. The dielectric material may be recessed using a wet etch by dipping the top surface of the fins 122 into an etchant selective to the material of the dielectric material, although other methods, such as a reactive ion etch, a dry etch, chemical oxide removal, or dry chemical clean may be used.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form the dielectric material. All of the potential process steps are fully intended to be included within the scope of the present embodiment. Additionally, the formation of the first isolation regions 135 may be performed at other points within the manufacturing process, such as by being performed prior to the formation of the first semiconductor layer 103. All such steps and times are fully intended to be included within the scope of the embodiments.

FIG. 1A also illustrates the formation of a dummy gate dielectric 119 and a dummy gate electrode 121 over the eighth semiconductor layer 117. In an embodiment the dummy gate dielectric 119 may be formed by thermal oxidation, chemical vapor deposition, sputtering, or any other methods known and used in the art for forming a gate dielectric. Depending on the technique of gate dielectric formation, the dummy gate dielectric 119 thickness on the top may be different from the dummy dielectric thickness on the sidewall.

The dummy gate dielectric 119 may comprise a material such as silicon dioxide or silicon oxynitride with a thickness ranging from about 3 angstroms to about 100 angstroms, such as about 10 angstroms. The dummy gate dielectric 119 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 119.

The dummy gate electrode 121 may comprise a conductive material and may be selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 121 may be deposited by chemical vapor deposition (CVD), sputter deposition, or other techniques known and used in the art for depositing conductive materials. The thickness of the dummy gate electrode 121 may be in the range of about 5 Å to about 500 Å. The top surface of the dummy gate electrode 121 may have a non-planar top surface, and may be planarized prior to patterning of the dummy gate electrode 121 or gate etch. Ions may or may not be introduced into the dummy gate electrode 121 at this point. Ions may be introduced, for example, by ion implantation techniques.

Once the dummy gate dielectric 119 and the dummy gate electrode 121 have been formed, the dummy gate dielectric 119 and the dummy gate electrode 121 may be patterned. In an embodiment the patterning may be performed by initially forming a first hard mask 123 and a second hard mask 125 over the first hard mask 123. The first hard mask 123 comprises a dielectric material such as silicon oxide, silicon nitride, titanium nitride, silicon oxynitride, combinations of these, or the like. The first hard mask 123 may be formed using a process such as chemical vapor deposition, plasma enhanced chemical vapor deposition, atomic layer deposition, or the like. However, any other suitable material and method of formation may be utilized. The first hard mask 123 may be formed to a thickness of between about 20 Å and about 3000 Å, such as about 20 Å.

The second hard mask 125 comprises a separate dielectric material such as silicon nitride, silicon oxide, titanium nitride, silicon oxynitride, combinations of these, or the like. The second hard mask 125 may be formed using a process such as chemical vapor deposition, plasma enhanced chemical vapor deposition, atomic layer deposition, or the like. However, any other suitable material and method of formation may be utilized. The second hard mask 125 may be formed to a thickness of between about 20 Å and about 3000 Å, such as about 20 Å.

Once the first hard mask 123 and the second hard mask 125 have been formed, the first hard mask 123 and the second hard mask 125 may be patterned. In an embodiment the first hard mask 123 and the second hard mask 125 may be patterned by initially placing a first photoresist (not individually illustrated) over the first hard mask 123 and the second hard mask 125 and exposing the first photoresist to a patterned energy source (e.g. light) in order to initiate a chemical reaction that modifies the physical properties of the exposed portions of the first photoresist. The first photoresist may then be developed by applying a first developer (also not individually illustrated) in order to utilize the modified physical properties between the exposed region and the unexposed region to selectively remove either the exposed region or the unexposed region.

Once the first photoresist has been patterned, the first photoresist may be used as a mask in order to pattern the underlying first hard mask 123 and the second hard mask 125. In an embodiment the first hard mask 123 and the second hard mask 125 may be patterned using, e.g., one or more reactive ion etching processes with the first photoresist as a mask. The patterning process may be continued until the dummy gate electrode 121 is exposed beneath the first hard mask 123.

Once the first hard mask 123 and the second hard mask 125 have been patterned, the first photoresist may be removed from the first hard mask 123 and the second hard mask 125. In an embodiment the first photoresist may be removed utilizing, e.g., an ashing process, whereby a temperature of the first photoresist is raised until the first photoresist experiences a thermal decomposition and may be easily removed using one or more cleaning process. However, any other suitable removal process may be utilized.

Once the first hard mask 123 and the second hard mask 125 have been patterned, the dummy gate electrode 121 and the dummy gate dielectric 119 may be patterned in order to form a series of stacks 129. In an embodiment the dummy gate electrode 121 and the dummy gate dielectric 119 are patterned using an anisotropic etching process, such as a reactive ion etch, although any suitable process may be utilized.

FIG. 1A also illustrates a formation of a first spacer layer 127 over the dummy gate electrode 121 and the dummy gate dielectric 119. The first spacer layer 127 may be formed on opposing sides of the stacks 129. The first spacer layer 127 maybe formed by blanket depositing the first spacer layer 127 on the previously formed structure. The first spacer layer 127 may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art.

Once formed, a third photoresist (not separately illustrated in FIG. 1A) may be formed to protect the first spacer layer 127 located within the I/O region 104 while exposing the first spacer layer 127 within the core region 102. Once the first spacer layer 127 has been protected in the I/O region 104, the first spacer layer 127 within the core region 102 may be etched in order to form first spacers 131 on the stacks 129 within the core region 102. In an embodiment the first spacers 131 may be formed using an anisotropic etching process such as a reactive ion etching process.

Additionally, during the formation of the first spacers 131, the eighth semiconductor layer 117 will be exposed within the core region 102 (without exposing the eighth semiconductor layer 117 within the I/O region 104). As such, FIG. 1A additionally illustrates an etching of the eighth semiconductor layer 117, the seventh semiconductor layer 115, the sixth semiconductor layer 113, the fifth semiconductor layer 111, the fourth semiconductor layer 109, the third semiconductor layer 107, the second semiconductor layer 105, the first semiconductor layer 103, and the semiconductor substrate 101 to form core openings 133. In an embodiment the etching to the semiconductor substrate 101 may be performed using one or more anisotropic etches, such as reactive ion etches, although any suitable processes may be utilized.

In an embodiment the core openings 133 may be formed to have a first width $W_1$ of between about 10 nm and about 40 nm, such as about 20 nm. Additionally, the core openings 133 may be formed to extend into the semiconductor substrate 101 a first depth $D_1$ of between about 5 nm and about 20 nm, such as about 10 nm. However, any suitable dimensions may be utilized.

Once the core openings 133 have been formed, the third photoresist may be removed. In an embodiment the third photoresist may be removed utilizing, e.g., an ashing process, whereby a temperature of the third photoresist is raised until the second photoresist experiences a thermal decomposition and may be easily removed using one or more cleaning process. However, any other suitable removal process may be utilized.

Figure 1B:
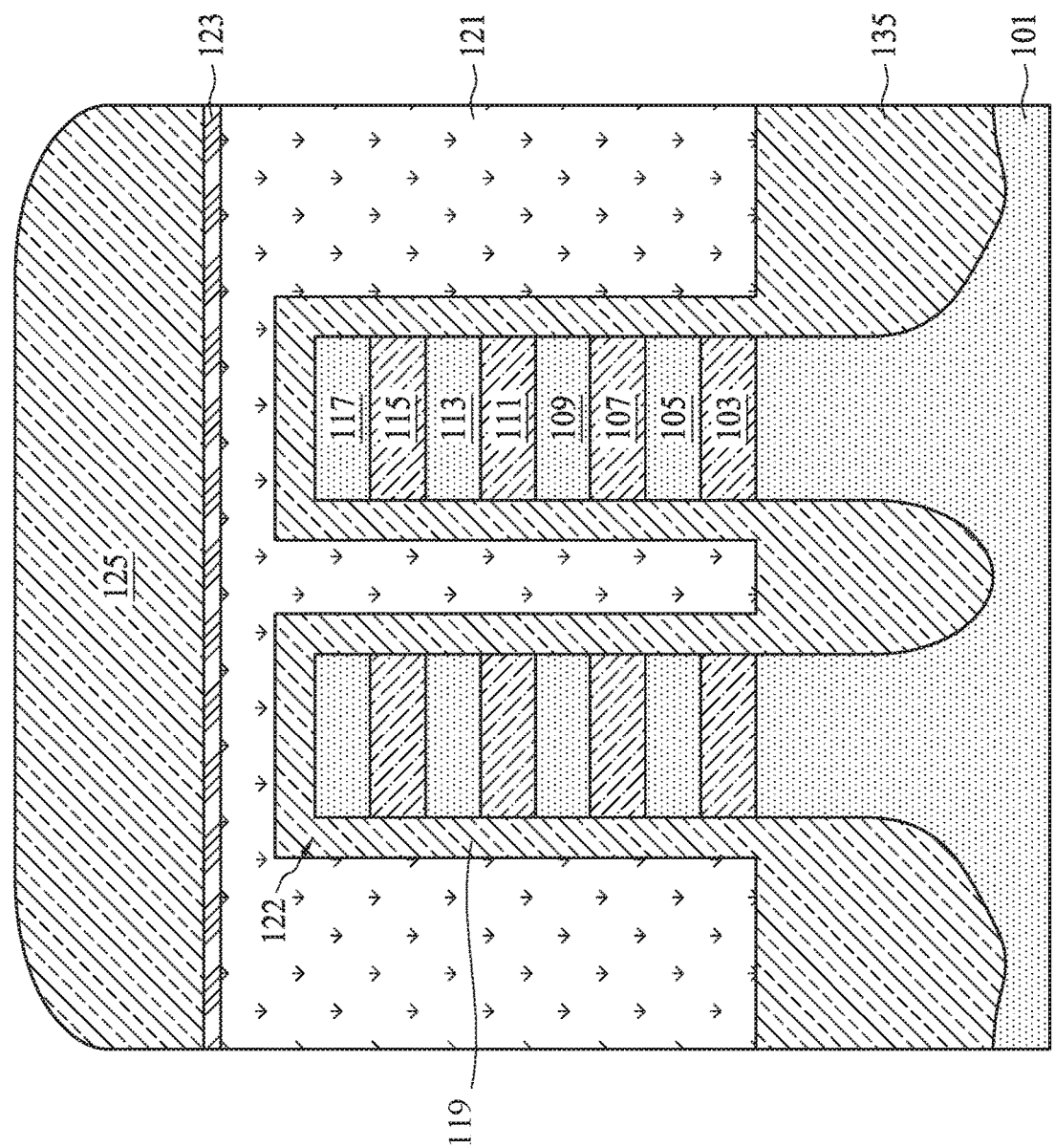

FIG. 1B illustrates a cross-sectional view of the structure of FIG. 1A through line B-B'. As can be seen, the fin 122 is covered by the dummy gate dielectric 119 on three sides such that the three sides of the fin are protected at this point in the manufacturing process. FIG. 1B additionally illustrates that multiples fins 122 may be formed and covered by the dummy gate dielectric 119 and the dummy gate electrode 121.

Figure 2:
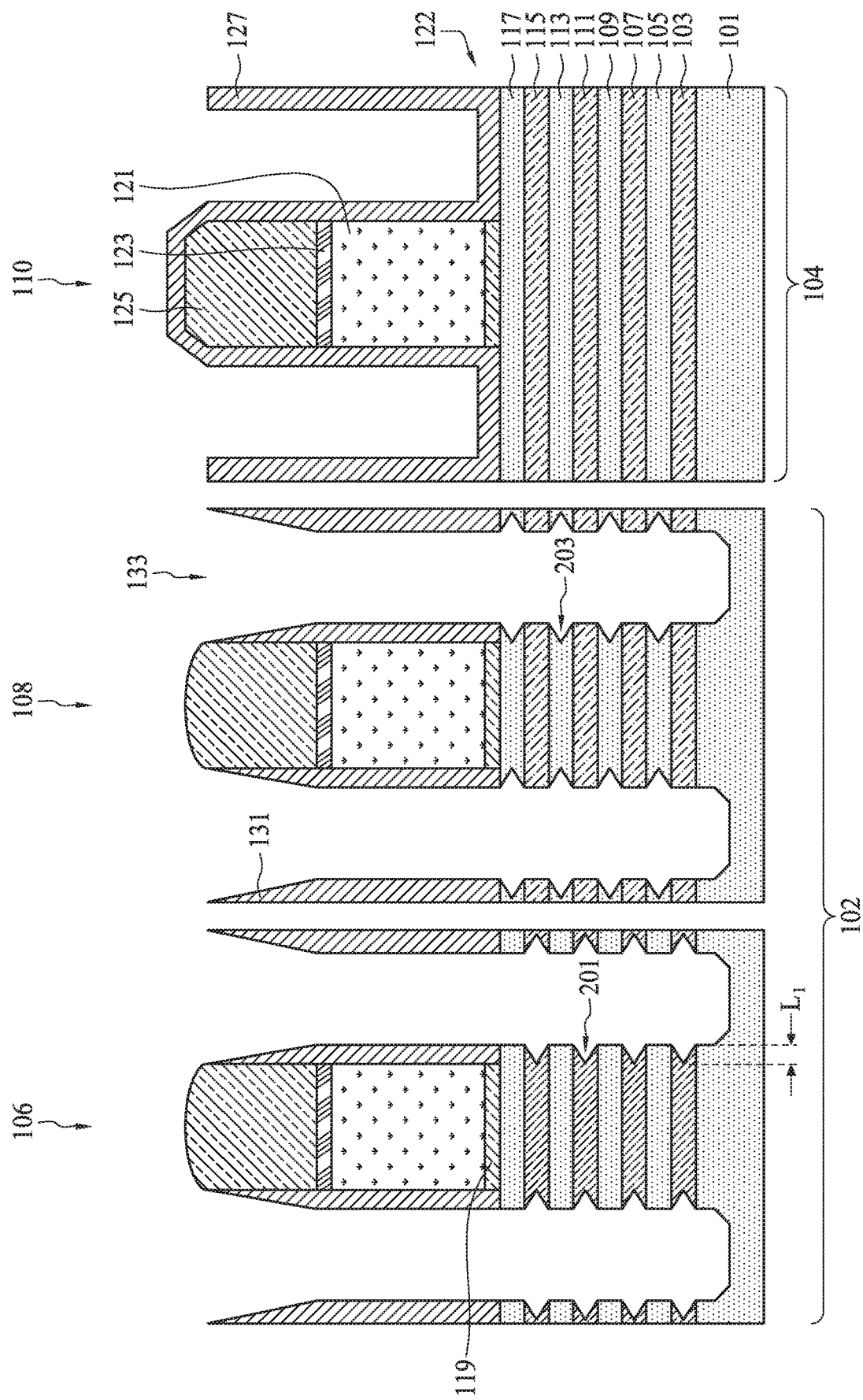
FIG. 2 illustrates a formation of first and second recesses, in accordance with some embodiments.

FIG. 2 illustrates a patterning of the first semiconductor layer 103, the third semiconductor layer 107, the fifth semiconductor layer 111, and the seventh semiconductor layer 115 in order to form first inner spacers 501 (not separately illustrated in FIG. 2 but illustrated and discussed further below with respect to FIG. 5). In an embodiment the patterning of the first semiconductor layer 103, the third semiconductor layer 107, the fifth semiconductor layer 111, and the seventh semiconductor layer 115 is performed using a wet etch with an etchant selective to the material of the first semiconductor layer 103, the third semiconductor layer 107, the fifth semiconductor layer 111, and the seventh semiconductor layer 115 (e.g., silicon germanium) without significantly removing the material of the second semiconductor layer 105, the fourth semiconductor layer 109, the sixth semiconductor layer 113, and the eighth semiconductor layer 117 (e.g., silicon). For example, in an embodiment in which the first semiconductor layer 103 is silicon germanium and the second semiconductor layer 105, the wet etch may use an etchant such as hydrochloric acid (HCl).

In another embodiment the patterning of the first semiconductor layer 103, the third semiconductor layer 107, the fifth semiconductor layer 111, and the seventh semiconductor layer 115 may be performed with a dry etching process or a combination of a dry etching process and a wet etching process. Any suitable process of patterning the first semiconductor layer 103, the third semiconductor layer 107, the fifth semiconductor layer 111, and the seventh semiconductor layer 115 may be utilized, and all such processes are fully intended to be included within the scope of the embodiments.

In an embodiment the wet etching process may be a dip process, a spray process, a spin-on process, or the like. Additionally, the wet etching process may be performed at a temperature of between about 400° C. and about 600° C. and may be continued for a time of between about 100 seconds and about 1000 seconds, such as about 300 seconds. However, any suitable process conditions and parameters may be utilized.

The etching process may be continued to recess the first semiconductor layer 103, the third semiconductor layer 107, the fifth semiconductor layer 111, and the seventh semiconductor layer 115 such that (111) facet limited surfaces of first recesses 201 are formed in each layer between the first semiconductor layer 103, the third semiconductor layer 107, the fifth semiconductor layer 111, and the seventh semiconductor layer 115. In an embodiment the first recesses 201 may be recessed a first length $L_1$ of between about 3 nm and about 8 nm, such as about 5 nm. However, any suitable dimension may be utilized.

Additionally, while the etching process is utilized to form the first recesses 201 within the cores region 102, the first spacer layer 127 protects the structures within the I/O region 104. As such, none of the first recesses 201 are formed within the I/O region 104. This allows the fin 122 to remain suitable for use as a finFET device.

Additionally, once the first recesses 201 have been formed, second recesses 203 may be formed within the second semiconductor layer 105, the fourth semiconductor layer 109, the sixth semiconductor layer 113, and the eighth semiconductor layer 117. In an embodiment the second recesses 203 may be formed in a similar fashion as the first recesses 201. For example, the second recesses 203 may be formed with a wet etching process that utilizes an etchant selective to the material of the second semiconductor layer 105, the fourth semiconductor layer 109, the sixth semiconductor layer 113, and the eighth semiconductor layer 117 (e.g., silicon), such as TMAH or $NH_3$ (in solution).

In an embodiment the wet etching process using TMAH or $NH_3$ may be a dip process, a spray process, a spin-on process, or the like. Additionally, the wet etching process may be performed at a temperature of between about 25° C. and about 100° C. and may be continued for a time of between about 10 seconds and about 200 seconds, such as about 30 seconds. However, any suitable process conditions and parameters may be utilized.

In another embodiment, the first recesses 201 and the second recesses 203, instead of being formed using a single wet etching process, may be formed using a dry etching process. In yet another embodiment a combination of wet etching and dry etching processes may be utilized to form either the first recesses 201 or the second recesses 203.

Figure 3:
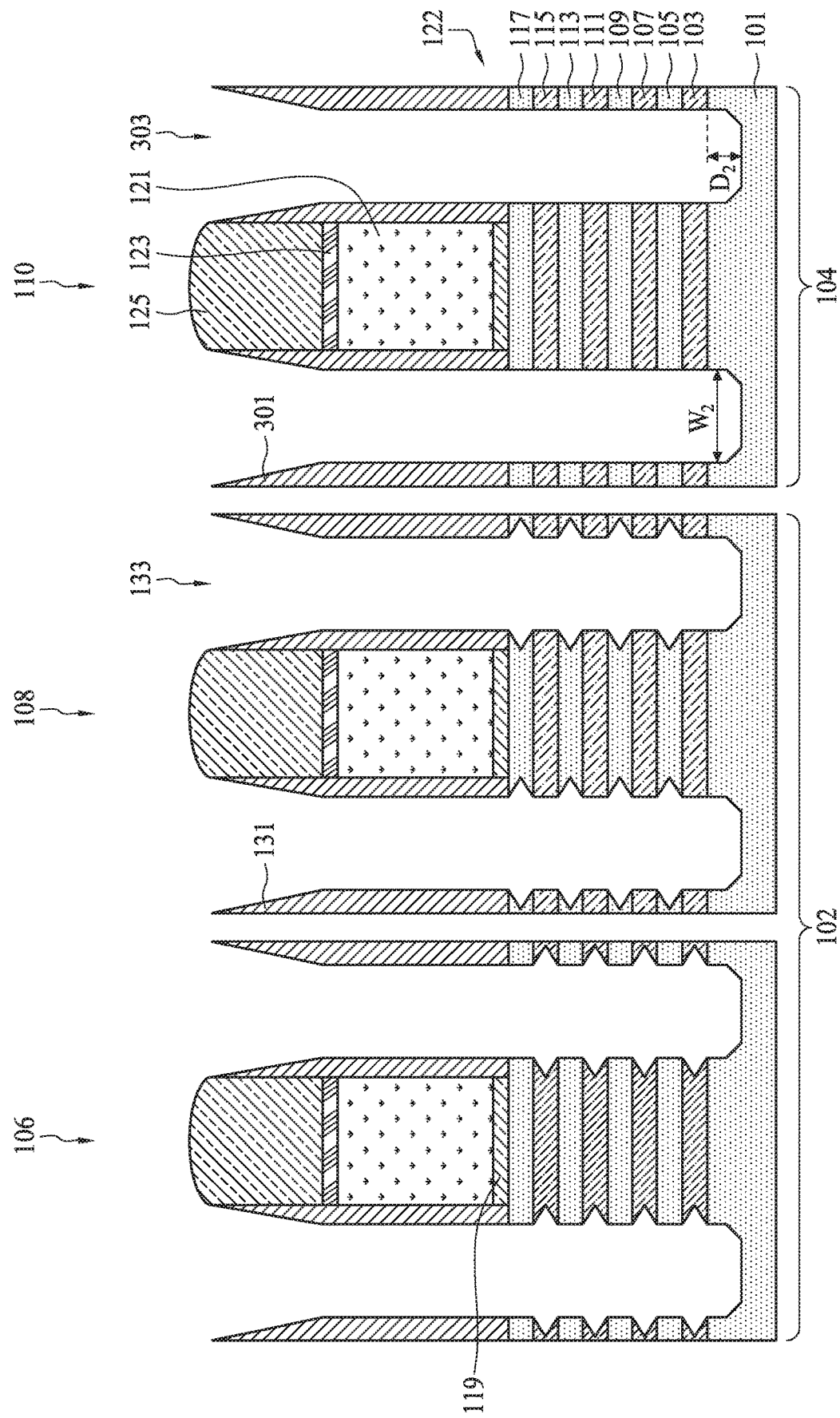
FIG. 3 illustrates a formation of I/O openings, in accordance with some embodiments.

FIG. 3 illustrates that, once the first recesses 201 and the second recesses 203 have been formed within the core region 102, I/O openings 303 may be formed in the I/O region 104. In an embodiment, a fourth photoresist (not separately illustrated in FIG. 3) may be formed to protect the devices within the core region 102, while exposing the first spacer layer 127 within the I/O region 104. Once the first spacer layer 127 has been exposed in the I/O region 104, the first spacer layer 127 within the I/O region 104 may be etched in order to form second spacers 301 on the stacks 129 within the I/O region 104. In an embodiment the second spacers 301 may be formed using an anisotropic etching process such as a reactive ion etching process.

Additionally, during the formation of the second spacers 301, the eighth semiconductor layer 117 will be exposed within the I/O region 104. As such, FIG. 3 additionally illustrates an etching of the eighth semiconductor layer 117, the seventh semiconductor layer 115, the sixth semiconductor layer 113, the fifth semiconductor layer 111, the fourth semiconductor layer 109, the third semiconductor layer 107, the second semiconductor layer 105, the first semiconductor layer 103, and the semiconductor substrate 101 to form I/O openings 303. In an embodiment the etching to the semiconductor substrate 101 may be performed using one or more anisotropic etches, such as reactive ion etches, although any suitable processes may be utilized.

In an embodiment the I/O openings 303 may be formed to have a second width $W_2$ of between about 10 nm and about 100 nm, such as about 30 nm. Additionally, the I/O openings 303 may be formed to extend into the semiconductor substrate 101 a second depth $D_2$ of between about 5 nm and about 30 nm, such as about 15 nm. However, any suitable dimensions may be utilized.

Once the I/O openings 303 have been formed, the third photoresist may be removed. In an embodiment the fourth photoresist may be removed utilizing, e.g., an ashing process, whereby a temperature of the fourth photoresist is raised until the fourth photoresist experiences a thermal decomposition and may be easily removed using one or more cleaning process. However, any other suitable removal process may be utilized.

Figure 4:
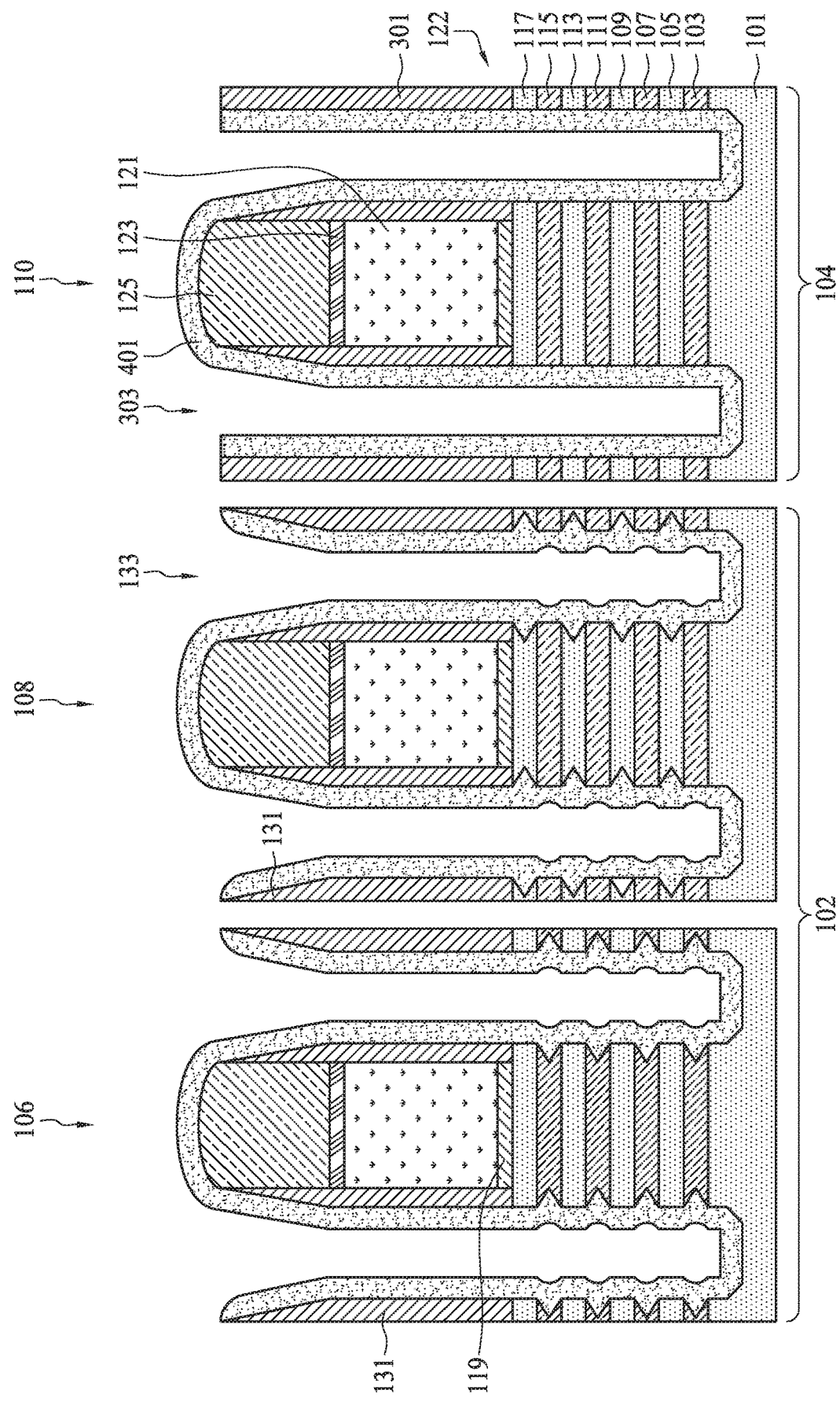
FIG. 4 illustrates a formation of a common spacer, in accordance with some embodiments.

FIG. 4 illustrates a deposition of a common spacer 401 over both the core region 102 as well as the I/O region 104. In an embodiment the common spacer 401 is a material such as silicon nitride, silicon oxynitride, although any suitable material, such as low-k materials with a k-value less than about 3.5, may be utilized. The common spacer 401 may be deposited using a deposition process such as chemical vapor deposition, physical vapor deposition, or atomic layer deposition to a thickness of between about 3 nm and about 10 nm, such as about 5 nm. However, any suitable thickness or deposition process may be utilized.

By depositing the common spacer 401 over both the core region 102 and the I/O region 104, the common spacer 401 will not only line the sidewalls of the core openings 133 and the I/O openings 303, but will also fill in the first recesses 201 and the second recesses 203 that were formed within the core region 102. The filling of the first recesses 201 and the second recesses 203 will help form the first nanowires 901 and the second nanowires 1001, described further below with respect to FIG. 9A and FIG. 10A.

Figure 5:
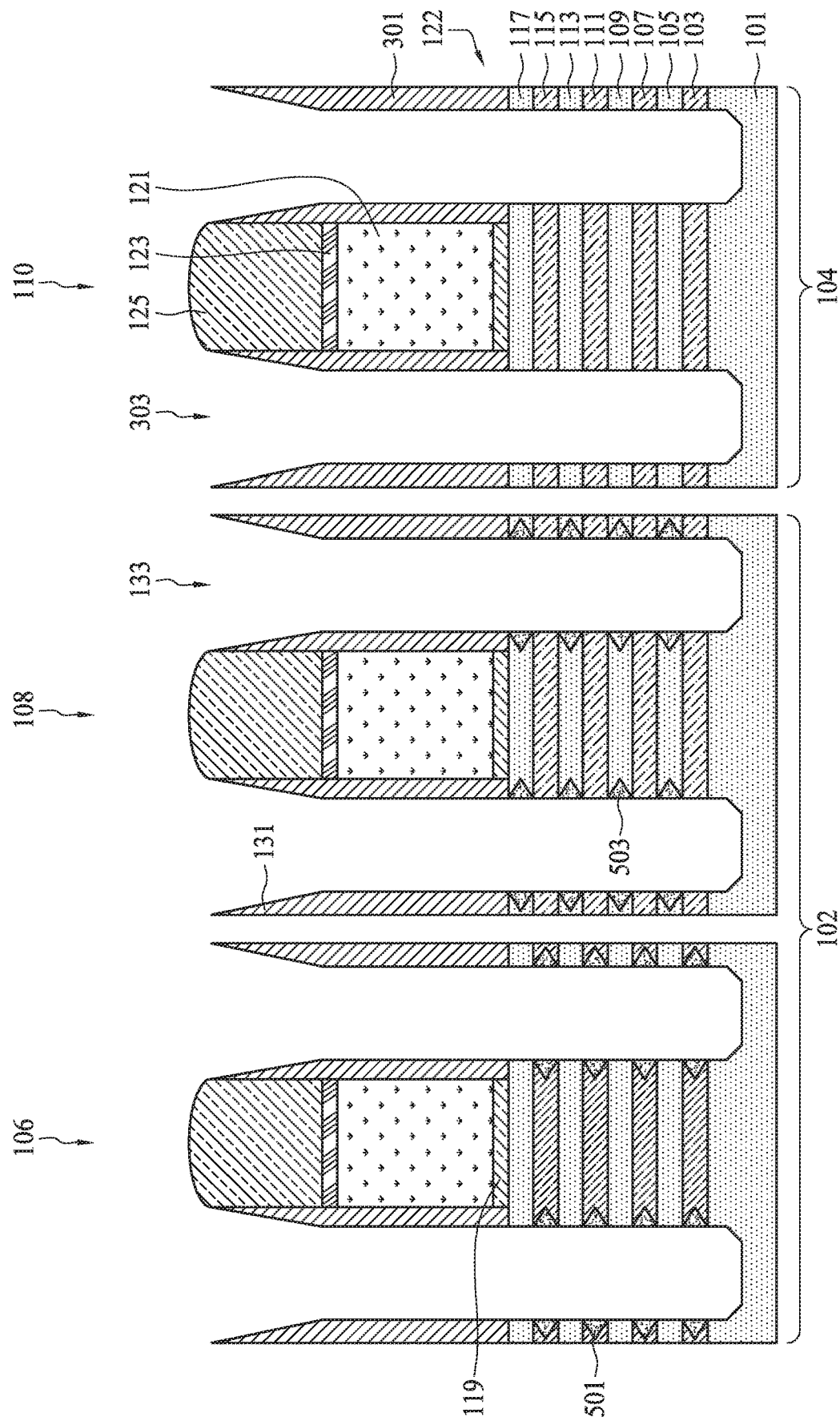
FIG. 5 illustrates a formation of first inner spacers and second inner spacers, in accordance with some embodiments.

FIG. 5 illustrates a removal of the common spacer 401 from both the core region 102 and the I/O region 104, while leaving behind first inner spacers 501 which fill the first recesses 201 and also leave behind second inner spacers 503 which fill the second recesses 203. In an embodiment the removal of the common spacer 401 may be performed using an etching process such as, e.g., an anisotropic, dry etching process such as a reactive ion etch. However, any suitable etching process, which removes the common spacer 401 while leaving behind the first inner spacers 501 and the second inner spacers 503, may be utilized.

Once the common spacer 401 has been removed from both of the core region 102 and the I/O region 104, any residual material from the common spacer 401 (e.g., silicon nitride) may be removed from the layers (e.g., the second semiconductor layer 105, the fourth semiconductor layer 109, the sixth semiconductor layer 113, and the eighth semiconductor layer 117) using a wet etching process.

Additionally, while the common spacer 401 is completely removed from the I/O region 104, the first inner spacers 501 will remain to fill the first recesses 201 within the core region 102 and the second inner spacers 503 will remain to fill the second recesses 203 within the core region 102. As such, the first inner spacers 501 will take on the shape of the first recesses 201 and the second inner spacers 503 will take on the shape of the second recesses 203. As such, the first inner spacers 501 may be formed to have the first length $L_1$ and the first thickness $T_1$. Additionally, the second inner spacers 503 may be formed to have the first length $L_1$ and the second thickness $T_2$. However, any suitable dimensions may be utilized.

Figure 6:
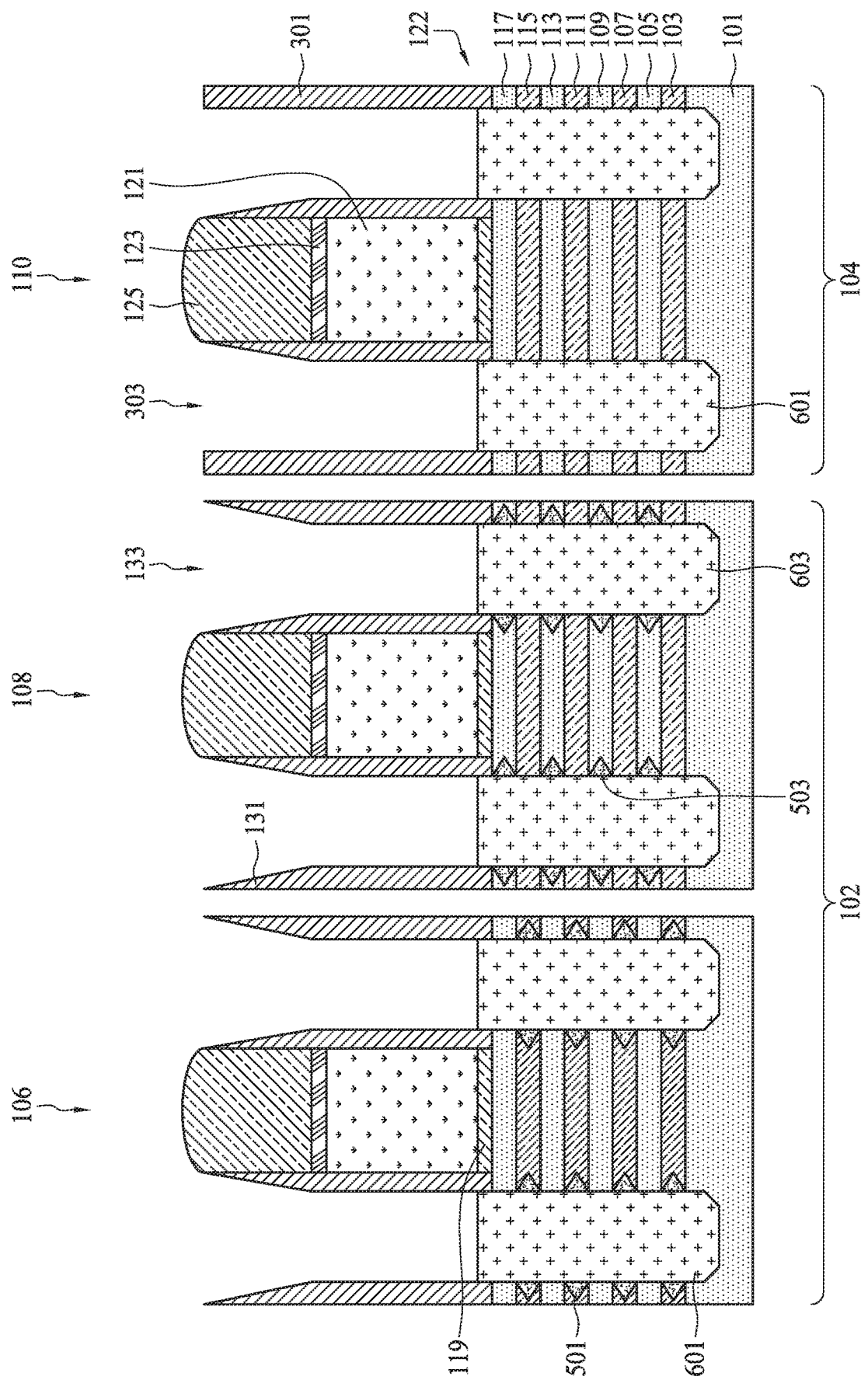
FIG. 6 illustrates a formation of source/drain regions, in accordance with some embodiments.

FIG. 6 illustrates a formation of first epitaxial source/drain regions 601 within both the core region 102 and the I/O region 104 as well as second epitaxial source/drain regions 603 within the core region 102. In an embodiment the first epitaxial source/drain regions 601 may be formed by initially protecting the second device 108 with, for example, a photoresist or other masking materials. Once the second device 108 has been protected, the first epitaxial source/drain regions 601 may be formed using a growth process such as a selective epitaxial process with a material such as silicon. The epitaxial growth process may use precursors such as silane, dichlorosilane, germane, and the like, and may continue for between about 5 minutes and about 120 minutes, such as about 30 minutes.

Once the first epitaxial source/drain regions 601 are formed, dopants may be implanted into the first epitaxial source/drain regions 601 by implanting appropriate dopants to complement the dopants within the remainder of the first device 106 and the third device 110. For example, n-type dopants such as phosphorous (to form SiP), arsenic, antimony, or the like may be implanted to form NMOS devices. These dopants may be implanted using the stacks 129, the first spacers 131, and the second spacers 301 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

In another embodiment the dopants of the first epitaxial source/drain regions 601 may be placed during the growth of the first epitaxial source/drain regions 601. For example, phosphorous may be placed in situ as the first epitaxial source/drain regions 601 are being formed. Any suitable process for placing the dopants within the first epitaxial source/drain regions 601 may be utilized, and all such processes are fully intended to be included within the scope of the embodiments.

Once the first epitaxial source/drain regions 601 have been formed, the second epitaxial source/drain regions 603 may be formed by removing the protection from the second device 108 (through, e.g., a process such as ashing) and protecting the first device 106 and the third device 110 with, for example, a photoresist or other masking material. Once the first device 106 and the third device 110 have been protected, the second epitaxial source/drain region 603 may be formed of a material such as silicon germanium using a process such as epitaxial growth, although any suitable material or process may be utilized. Additionally, either during the growth process or after the growth process, dopants such as boron (for a p-type device), may be placed within the second epitaxial source/drain region 603. After the second epitaxial source/drain regions 603 have been formed, the protection of the first device 106 and the third device 110 may be removed using a process such as ashing.

Figure 7:
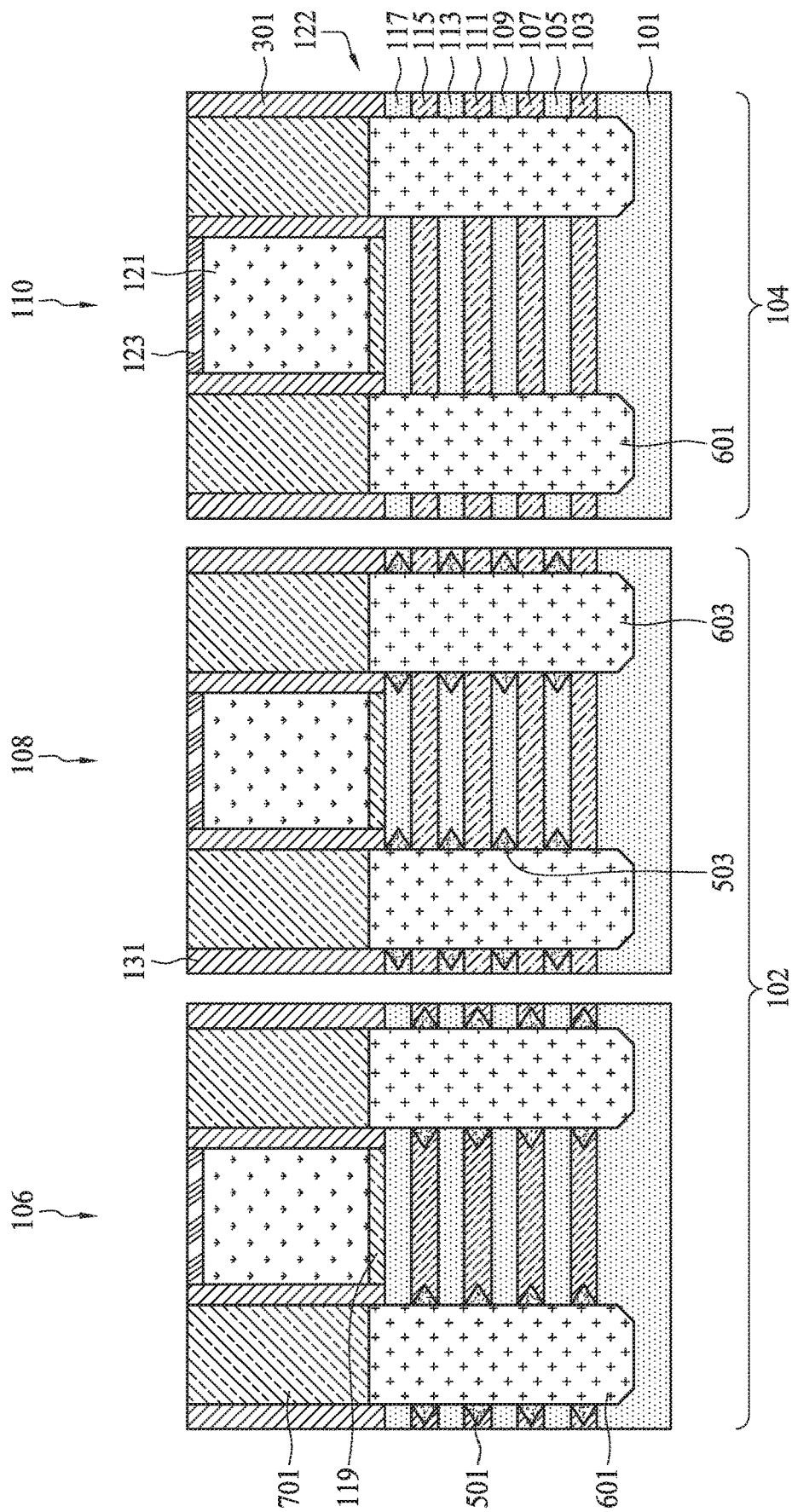
FIG. 7 illustrates a formation of an inter-layer dielectric, in accordance with some embodiments.

FIG. 7 illustrates a formation of an inter-layer dielectric (ILD) layer 701 over the first device 106, the second device 108, and the third device 110. The ILD layer 701 may comprise a material such as boron phosphorous silicate glass (BPSG), although any suitable dielectrics may be used. The ILD layer 701 may be formed using a process such as PECVD, although other processes, such as LPCVD, may alternatively be used. The ILD layer 701 may be formed to a thickness of between about 100 Å and about 3,000 Å. Once formed, the ILD layer 701 may be planarized with the first spacers 131 and second spacers 301 using, e.g., a planarization process such as chemical mechanical polishing process, although any suitable process may be utilized. Additionally, the planarization process can also remove the second hard mask 125 while stopping on the first hard mask 123.

Figure 8:
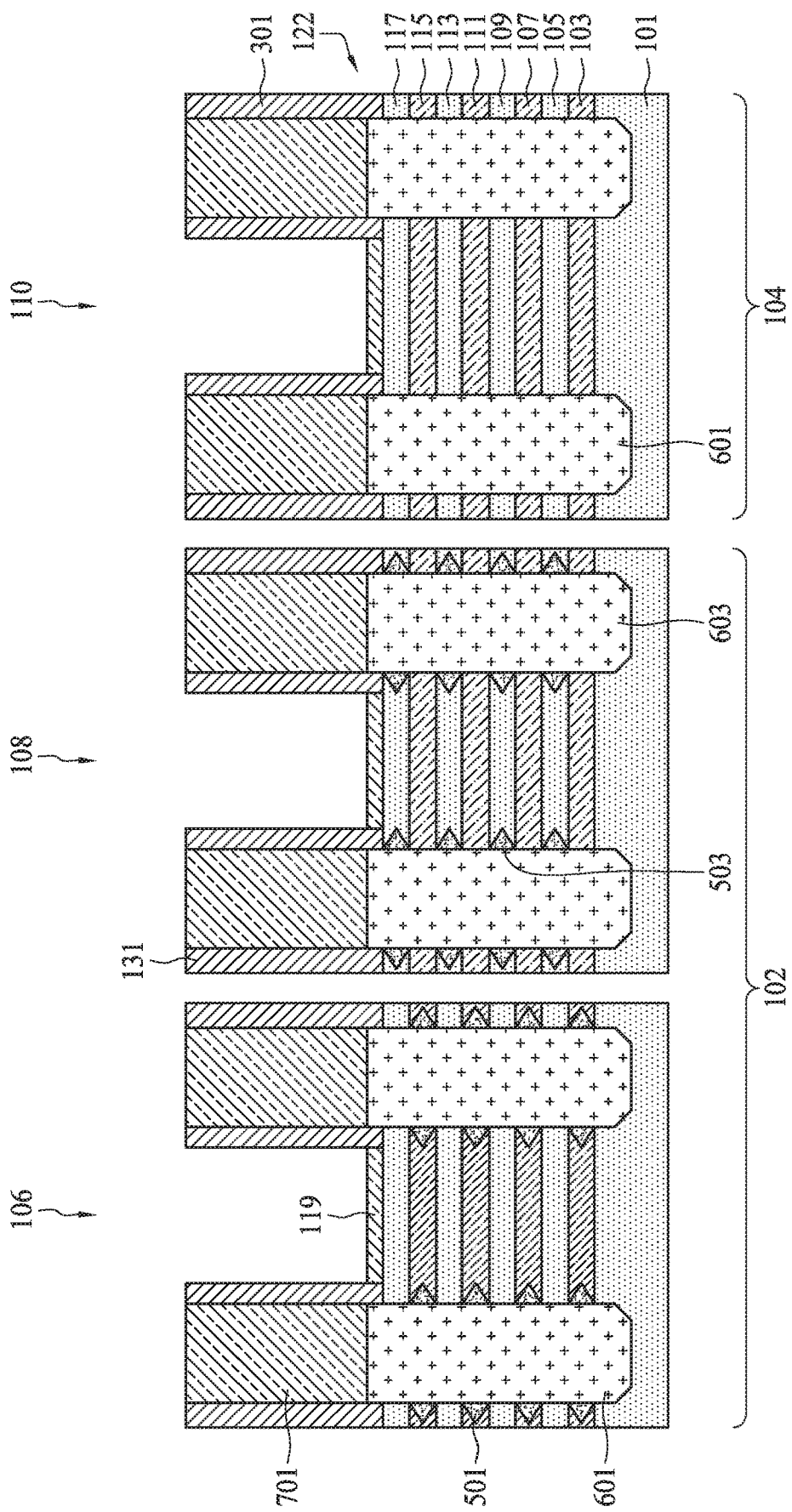
FIG. 8 illustrates a removal of a dummy gate electrode, in accordance with some embodiments.

FIG. 8 illustrates a removal of the first hard mask 123 as well as a removal of the dummy gate electrode 121. In an embodiment the first hard mask 123 may be removed using a planarization process such as a chemical mechanical polishing process to remove the material of the first hard mask 123 and planarize the material of the dummy gate electrode 121 to the material of the first spacers 131 and the second spacers 301. However, any suitable method of removing the first hard mask 123 to expose the material of the dummy gate electrode 121 may be utilized.

Once the dummy electrode 121 has been exposed, the dummy gate electrode 121 may be removed in order to expose the underlying dummy gate dielectric 119. In an embodiment the dummy gate electrode 121 may be removed using, e.g., one or more wet or dry etching process that utilizes etchants that are selective to the material of the dummy gate electrode 121. However, any suitable removal process may be utilized.

Figure 9A:
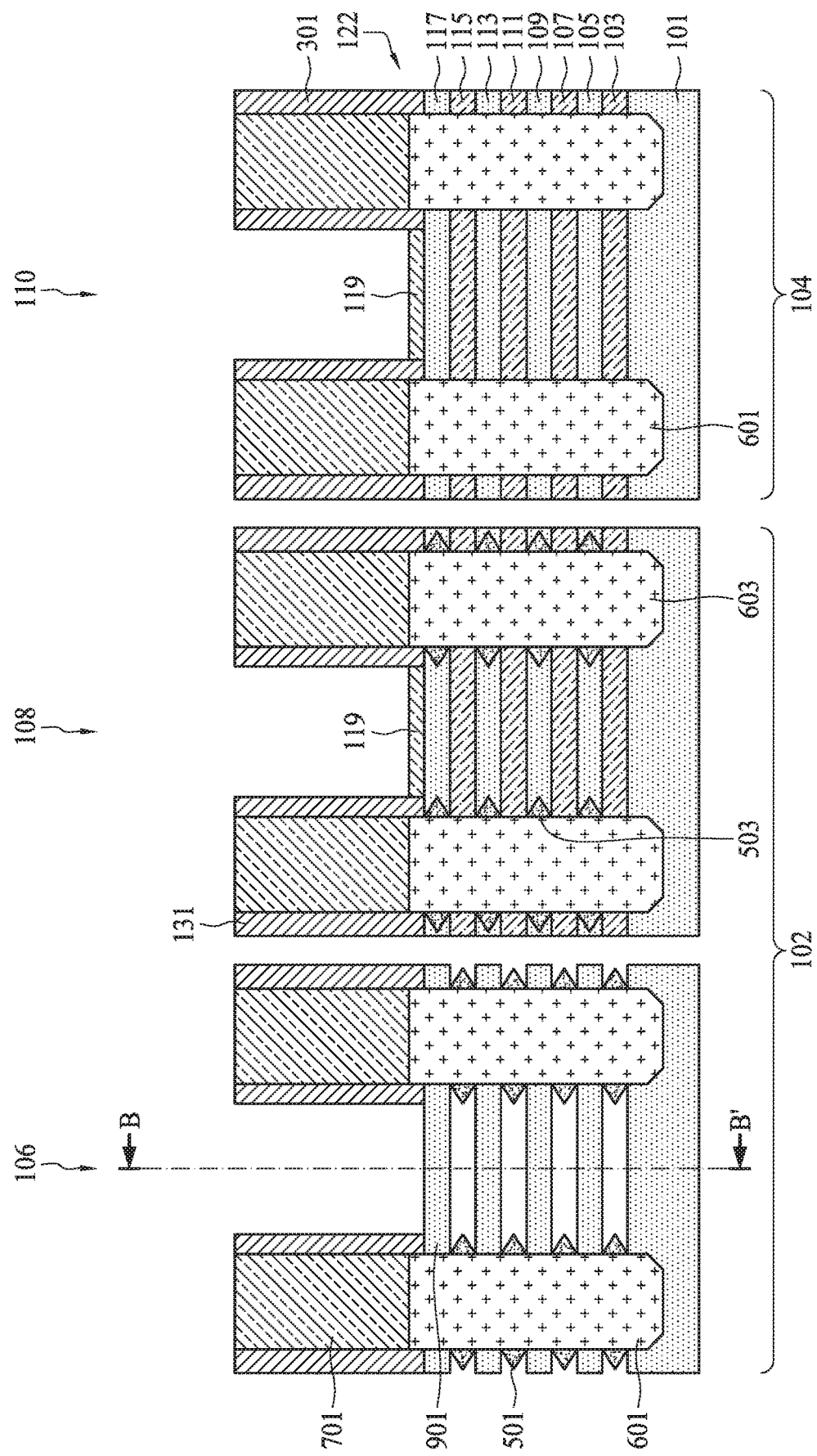
FIGS. 9A-9B illustrate a removal of a first material, in accordance with some embodiments.

FIG. 9A illustrates that, once the dummy gate dielectric 119 has been exposed, the dummy gate dielectric 119 within the first device 106 (e.g., the n-type device) may be removed without removing the dummy gate dielectric 119 within the second device 108 or the third device 110. In an embodiment the dummy gate dielectric 119 may be removed from the first device 106 by placing a protective material, such as a photoresist or other suitable masking material, over the second device 108 and the third device 110. Once the second device 108 and the third device no have been protected, the dummy gate dielectric 119 within the first device 106 may be removed using, e.g., a wet etching process, although any suitable etching process may be utilized.

Once the dummy gate dielectric 119 has been removed from the first device 106, the protective material over the second device 108 and the third device 110 may be removed. In an embodiment in which the protective material is a photoresist material, the protective material may be removed using an ashing process (whereby the temperature of the photoresist is increased until a decomposition of the photoresist material occurs) or a stripping process. However, any suitable method of removing the protective material may be utilized.

Figure 9B:
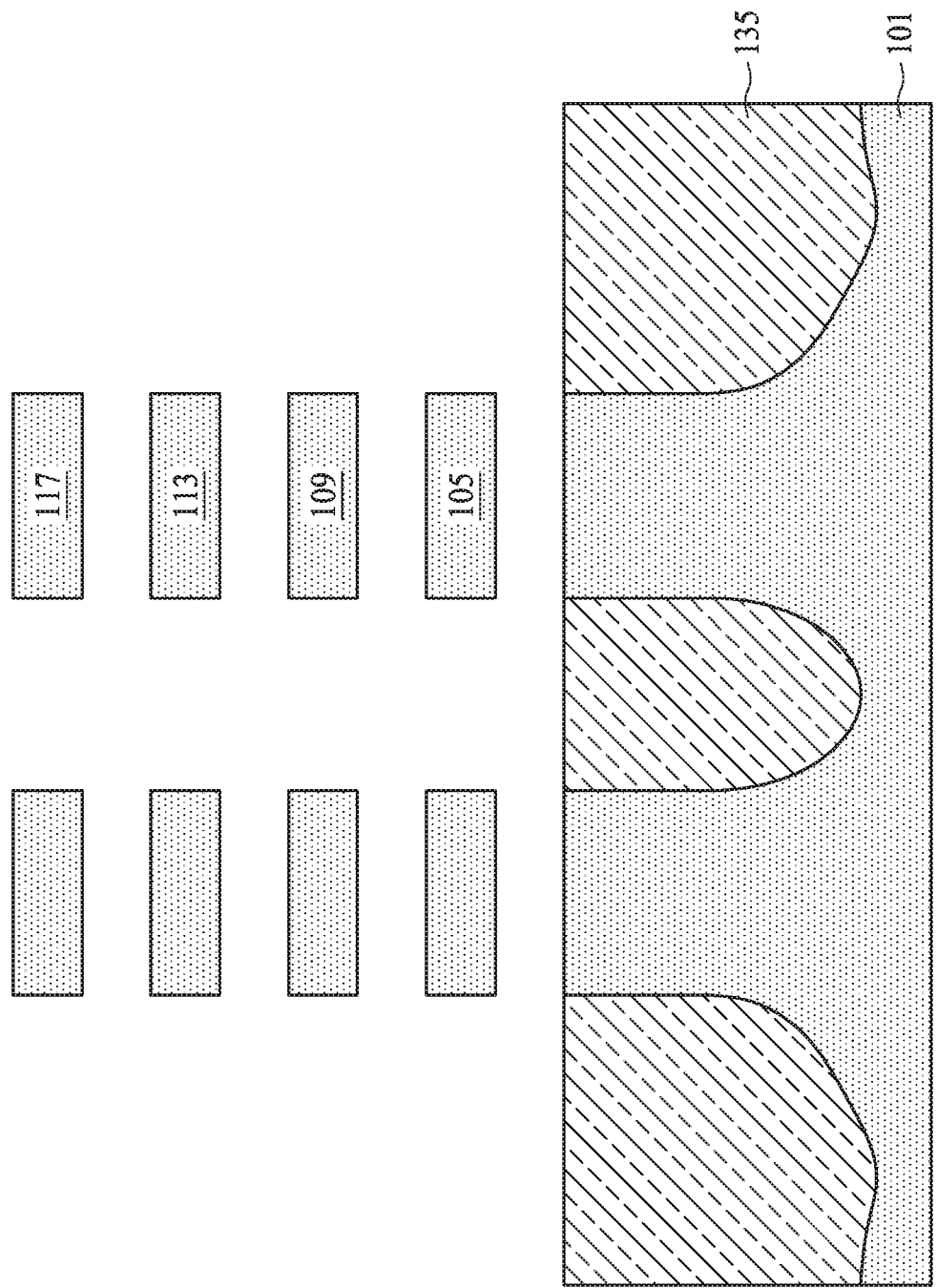

FIG. 9A additionally shows that, once the dummy gate dielectric 119 has been removed from the first device 106 (which also exposes the sides of the first semiconductor layer 103, the third semiconductor layer 107, the fifth semiconductor layer 111, and the seventh semiconductor layer 115 as can be seen in the cross-sectional view of FIG. 9B), the first semiconductor layer 103, the third semiconductor layer 107, the fifth semiconductor layer 111, and the seventh semiconductor layer 115 may be removed from between the semiconductor substrate 101, the second semiconductor layer 105, the fourth semiconductor layer 109, the sixth semiconductor layer 113, and the eighth semiconductor layer 117 within the first device 106. In an embodiment the first semiconductor layer 103, the third semiconductor layer 107, the fifth semiconductor layer 111, and the seventh semiconductor layer 115 may be removed using a wet etching process that selectively removes the material of the first semiconductor layer 103, the third semiconductor layer 107, the fifth semiconductor layer 111, and the seventh semiconductor layer 115 (e.g., silicon germanium) without significantly removing the material of the semiconductor substrate 101, the second semiconductor layer 105, the fourth semiconductor layer 109, the sixth semiconductor layer 113, and the eighth semiconductor layer 117 (e.g., silicon). However, any suitable removal process may be utilized.

For example, in an embodiment in which the material of the first semiconductor layer 103 is silicon germanium and the second semiconductor layer 105 is silicon, the removal of the first semiconductor layer 103 may be performed using an etchant that selectively removes the material of the first semiconductor layer 103 (e.g. silicon germanium) without substantively removing the material of the second semiconductor layer 105 (e.g., silicon). In an embodiment the etchant may be a high temperature HCl. Additionally, the wet etching process may be performed at a temperature of between about 400° C. and about 600° C., such as about 560° C., and for a time of between about 100 seconds and about 600 seconds, such as about 300 seconds. However, any suitable etchant, process parameters, and time can be utilized.

By removing the material of the first semiconductor layer 103, the third semiconductor layer 107, the fifth semiconductor layer 111, and the seventh semiconductor layer 115, the material of the second semiconductor layer 105, the fourth semiconductor layer 109, the sixth semiconductor layer 113, and the eighth semiconductor layer 117 within the first device 106 are formed into first nanowires 901 within the first device 106 separated from each other by the first inner spacers 501. The first nanowires 901 comprise the channel regions of the first device 106 that stretch between opposites ones of the first epitaxial source/drain regions 601 within the first device 106 once the first device 106 has been completed.

FIG. 9B illustrates a cross-sectional view of the first device 106 along line B-B' in FIG. 9A. As can be seen, once the dummy gate dielectric 119 has been removed, the sides of the first semiconductor layer 103, the second semiconductor layer 105, the third semiconductor layer 107, the fourth semiconductor layer 109, the fifth semiconductor layer 111, the sixth semiconductor layer 113, the seventh semiconductor layer 115, and the eighth semiconductor layer 117 are exposed. As such, the first semiconductor layer 103, the third semiconductor layer 107, the fifth semiconductor layer 111, and the seventh semiconductor layer 115 may be exposed to the etchant and removed from between the other layers in order to form the first nanowires 901.

Figure 10A:
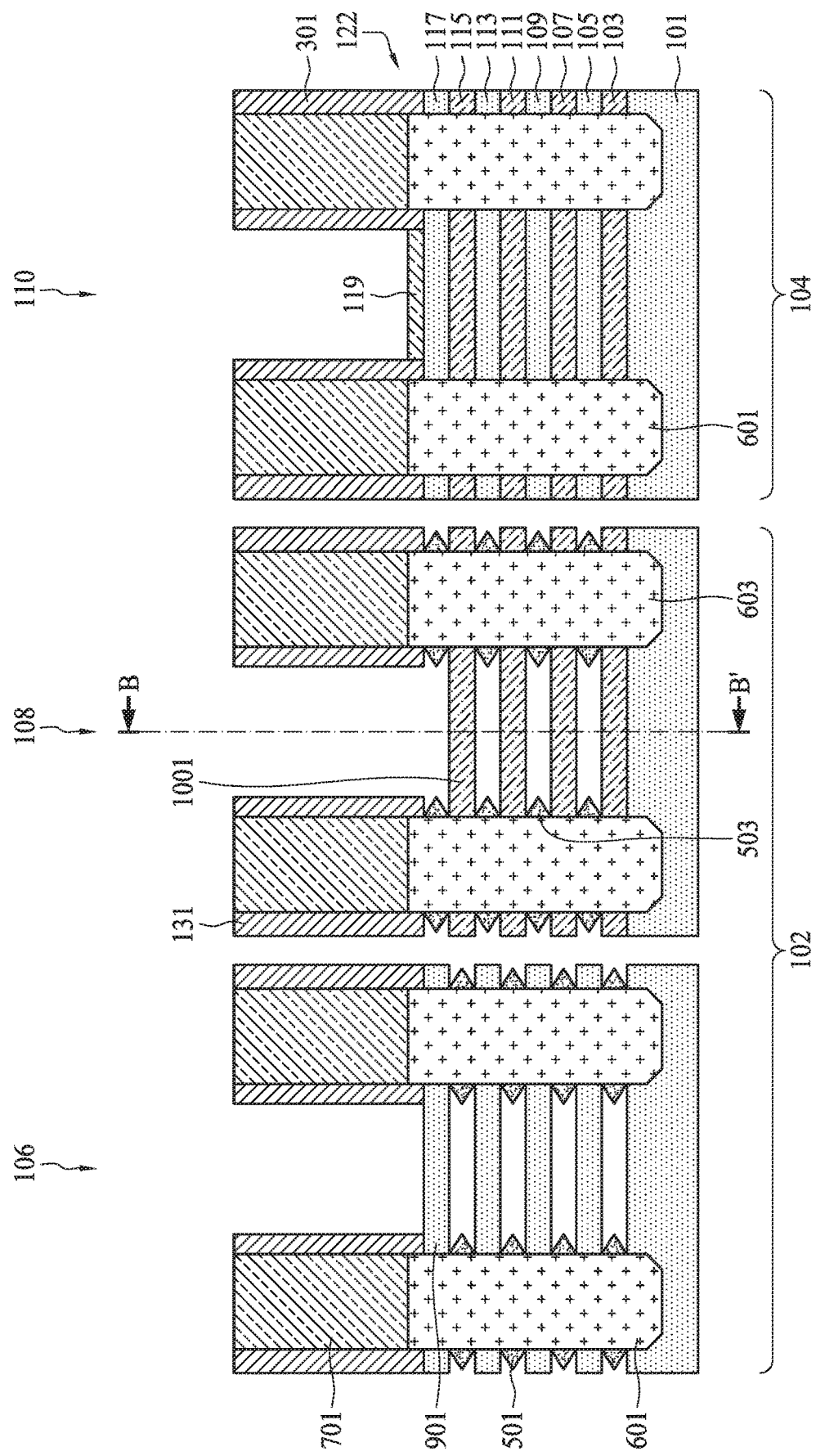
FIGS. 10A-10B illustrate a removal of a second material, in accordance with some embodiments.

FIG. 10A illustrates that, once the first nanowires 901 have been formed in the first device 106, second nanowires 1001 may be formed in the second device 108 by removing a portion of the semiconductor substrate 101, the second semiconductor layer 105, the fourth semiconductor layer 109, the sixth semiconductor layer 113, and the eighth semiconductor layer 117 from between the first semiconductor layer 103, the third semiconductor layer 107, the fifth semiconductor layer 111, and the seventh semiconductor layer 115 within the second device 108.

In an embodiment the dummy gate dielectric 119 may be removed from the second device 108 by placing a protective material, such as a photoresist or other suitable masking material, over the first device 106 and the third device 110. Once the first device 106 and the third device 110 have been protected, the dummy gate dielectric 119 within the second device 108 may be removed using, e.g., a wet etching process, although any suitable etching process may be utilized.

Once the dummy gate dielectric 119 has been removed from the second device 108, the protective material over the first device 106 and the third device 110 may be removed. In an embodiment in which the protective material is a photoresist material, the protective material may be removed using an ashing process (whereby the temperature of the photoresist is increased until a decomposition of the photoresist material occurs) or a stripping process. However, any suitable method of removing the protective material may be utilized.

Figure 10B:
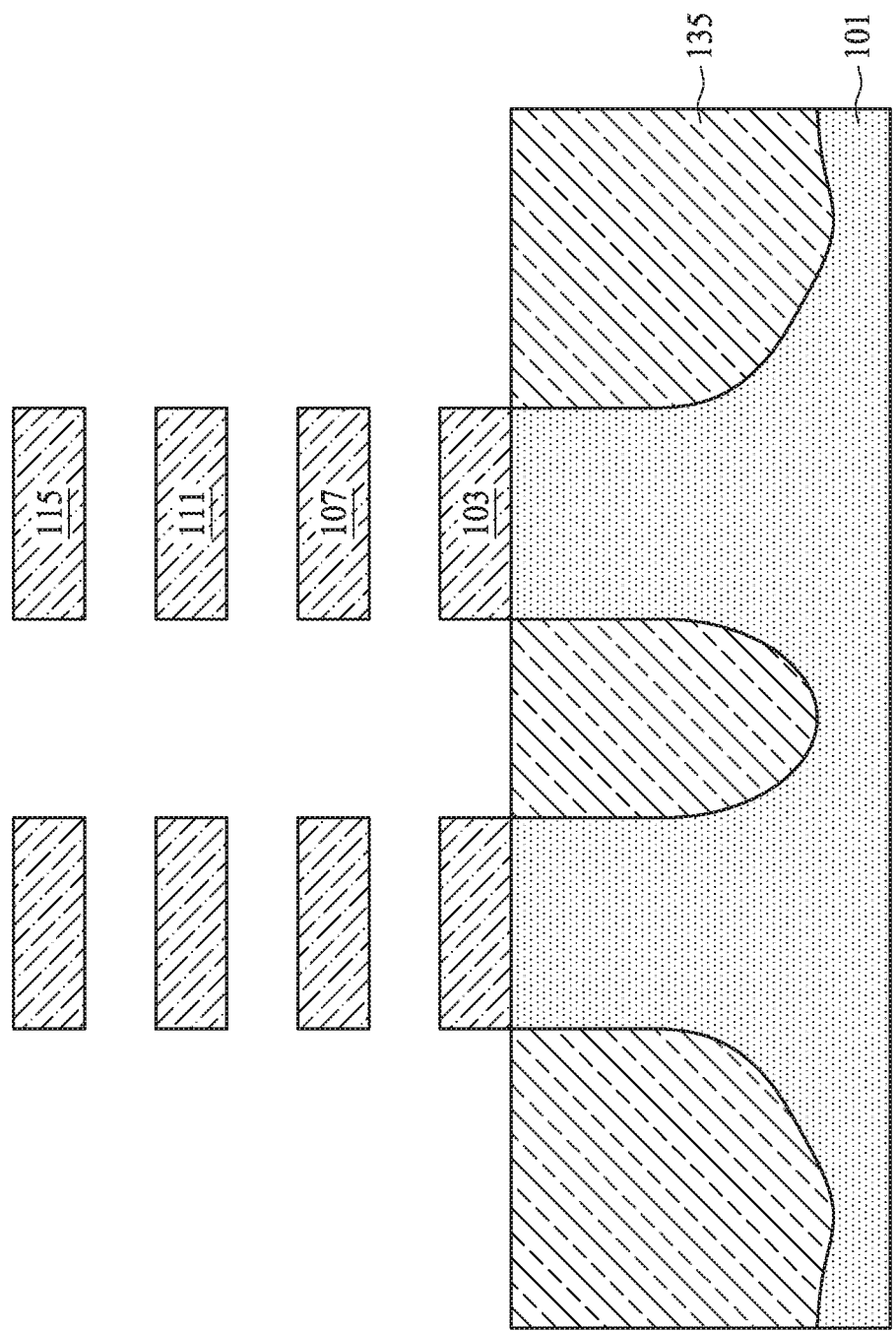

FIG. 10A additionally shows that, once the dummy gate dielectric 119 has been removed from the second device 108 (and also from the sides of the semiconductor substrate 101, the second semiconductor layer 105, the fourth semiconductor layer 109, the sixth semiconductor layer 113, and the eighth semiconductor layer 117 as illustrated in FIG. 10B), the semiconductor substrate 101, the second semiconductor layer 105, the fourth semiconductor layer 109, the sixth semiconductor layer 113, and the eighth semiconductor layer 117 may be removed from between the first semiconductor layer 103, the third semiconductor layer 107, the fifth semiconductor layer 111, and the seventh semiconductor layer 115.

In an embodiment the semiconductor substrate 101, the second semiconductor layer 105, the fourth semiconductor layer 109, the sixth semiconductor layer 113, and the eighth semiconductor layer 117 may be removed using a wet etching process that selectively removes the material of the semiconductor substrate 101, the second semiconductor layer 105, the fourth semiconductor layer 109, the sixth semiconductor layer 113, and the eighth semiconductor layer 117 (e.g., silicon) without significantly removing the material of the first semiconductor layer 103, the third semiconductor layer 107, the fifth semiconductor layer 111, and the seventh semiconductor layer 115 (e.g., silicon germanium). However, any suitable process may be used.

For example, in an embodiment in which the material of the first semiconductor layer 103 is silicon germanium and the second semiconductor layer 105 is silicon, the removal of the second semiconductor layer 105 may be performed using an etchant that selectively removes the material of the second semiconductor layer 105 (e.g., silicon) without substantively removing the material of the first semiconductor layer 103 (e.g., silicon germanium). In an embodiment the etchant to remove the second semiconductor layer 105 may be an etchant such as tetramethylammonium hydroxide (TMAH) or ammonium hydroxide solution. Additionally, the wet etching process may be performed at a temperature of between about 25° C. and about 100° C., such as about 30° C., and for a time of between about 10 seconds and about 200 seconds, such as about 60 seconds. However, any suitable etchant, process parameters, and time can be utilized.

By removing the material of the semiconductor substrate 101, the second semiconductor layer 105, the fourth semiconductor layer 109, the sixth semiconductor layer 113, and the eighth semiconductor layer 117, the material of the first semiconductor layer 103, the third semiconductor layer 107, the fifth semiconductor layer 111, and the seventh semiconductor layer 115 are formed into the second nanowires 1001 within the second device 108 separated from each other by the second inner spacers 503. The second nanowires 1001 comprise the channel regions of the second device 108 that stretch between opposites ones of the second epitaxial source/drain regions 603 within the second device 108 once the second device 108 has been completed.

Additionally, as can be seen in FIG. 10A, while the first nanowires 901 and the second nanowires 1001 are formed in the first device 106 and the second device 108 within the core region 102, the fin 122 within the third device 110 within the I/O region 104 remains unpatterned and continuous as it extends from the semiconductor substrate 101 between the first epitaxial source/drain regions 601.

FIG. 10B illustrates a cross-sectional view of the second device 108 along line B-B' in FIG. 10A. As can be seen, once the dummy gate dielectric 119 has been removed, the sides of the semiconductor substrate 101, the second semiconductor layer 105, the fourth semiconductor layer 109, the sixth semiconductor layer 113, and the eighth semiconductor layer 117 are exposed. As such, the semiconductor substrate 101, the second semiconductor layer 105, the fourth semiconductor layer 109, the sixth semiconductor layer 113, and the eighth semiconductor layer 117 may be exposed to the etchant and removed from between the other layers in order to form the second nanowires 1001.

Figure 11:
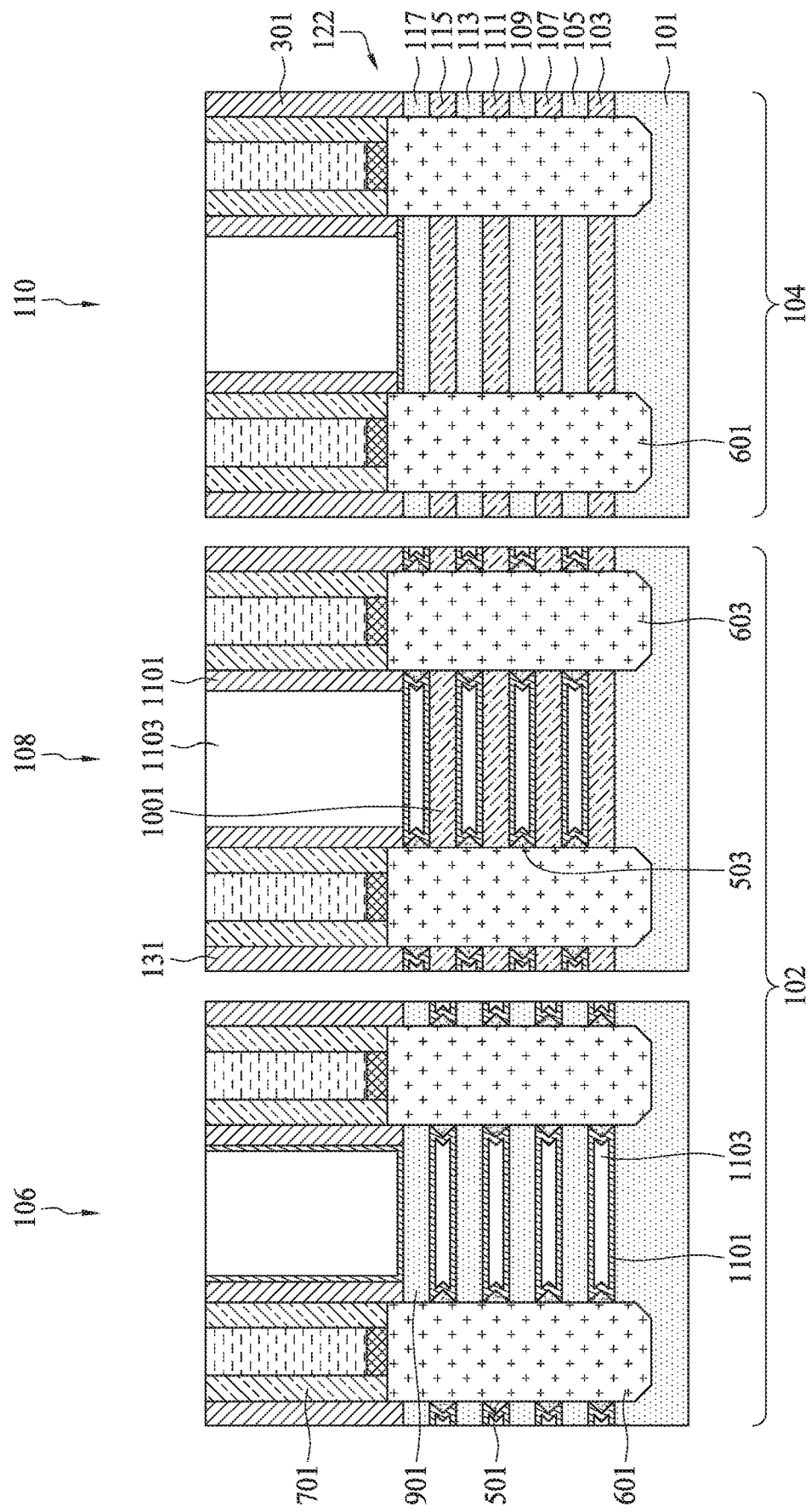
FIG. 11 illustrates a formation of a gate structure, in accordance with some embodiments.

FIG. 11A illustrates a removal of the dummy gate dielectric 119 within the third device 110 in the I/O region 104, and a formation of a gate dielectric 1101 within each of the first device 106, the second device 108, and the third device 110. In an embodiment the dummy gate dielectric 119 within the third device 110 may be removed using, e.g., a wet etching process, although any suitable etching process may be utilized.

Once the dummy gate dielectric 119 has been removed from the third device 110, the gate dielectric 1101 may be formed. Optionally, prior to the formation of the gate dielectric, a first interface layer and a second interface layer (not separately illustrated) may be formed. In an embodiment the first interface layer may be an interfacial material such as silicon, although any suitable material may be utilized. The interfacial material may be deposited using a deposition process such as atomic layer deposition or chemical vapor deposition to a non-zero thickness of less than about 20 Å, such as about 10 Å. However, any suitable method and thickness may be utilized.

In an embodiment the second interfacial layer comprises a buffer material such as silicon oxide, although any suitable material may be utilized. The second interfacial layer may be formed using a process such as CVD, PVD, or even oxidation to a thickness of between about 1 Å and about 20 Å, such as about 9 Å. However, any suitable process or thicknesses may be utilized.

In an embodiment the gate dielectric 1101 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The gate dielectric 1101 may be deposited to a thickness of between about 5 Å and about 200 Å, although any suitable material and thickness may be utilized. As illustrated, the gate dielectric 1101 wraps around the first nanowires 901 and the second nanowires 1001, thus forming channel regions of the first device 106 and the second device 108, respectively.

Once the gate dielectric 1101 has been formed, the gate electrode 1103 is formed to both overlie the first nanowires 901 (within the first device 106), the second nanowires 1001 (within the second device 108), and the eighth semiconductor layer 117 (within the third device 110), but also surrounds the first nanowires 901 (within the first device 106) and surrounds the second nanowires 1001 (within the second device 108). In an embodiment the gate electrode 1103 is formed using a conformal deposition method, such as atomic layer deposition (ALD) which allows for the filling of the space between the first nanowires 901 and the second nanowires 1001. However, any suitable material or method of formation may be utilized.

In another embodiment the gate electrode 1103 may comprise multiple layers, each deposited sequentially adjacent to each other, such as a first metal comprising material, a second metal comprising material, a blocking material, and a first nucleation layer. The first metal comprising material may be formed adjacent to the gate dielectric 1101 and may be formed from a metallic material such as titanium nitride doped with silicon (TSN), although other suitable materials, such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like, may also be utilized. In an embodiment in which the first metal comprising material is TSN, the first metal comprising material may be deposited using a deposition process such as atomic layer deposition, although other suitable processes, such as chemical vapor deposition, sputtering, or the like may also be used. The first metal comprising material may be deposited to a thickness of between about 5 Å and about 200 Å, although any suitable thickness may be used.

Once the first metal comprising material has been formed, the second metal comprising material may be formed adjacent to the first metal comprising material. In an embodiment, the second metal comprising material may be formed from a work function metal such as TiAl, Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal comprising material may be deposited using a deposition process such as atomic layer deposition, chemical vapor deposition, sputtering, or the like, to a thickness of between about 5 Å and about 200 Å, although any suitable deposition process or thickness may be used.

The blocking material may be used to block the movement of materials from the third metal comprising material to other regions. In an embodiment the blocking material may be a material such as titanium nitride, although any other suitable material may be used. The blocking material may be deposited using a process such as atomic layer deposition, chemical vapor deposition, sputtering, or the like, to a thickness of about 15 Å, although any suitable deposition process or thickness may be used.

After the blocking material has been deposited, the first nucleation layer is formed in order to allow for a first nucleation of the third metal comprising material. Additionally, in an embodiment the first nucleation layer is formed as a fluorine free material in order to help prevent the movement of fluorine into other portions of the structure. In a particular embodiment in which the third metal comprising material is tungsten, the first nucleation layer may be a material such as fluorine free tungsten (FFW).

The third metal comprising material fills a remainder of the opening left behind by the removal of the dummy gate electrode 121. In an embodiment the third metal comprising material is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as chemical vapor deposition, although any suitable process, such as atomic layer deposition, sputtering, or the like, may be used to fill and/or overfill the opening left behind by the removal of the dummy gate electrode 121. In a particular embodiment the third metal comprising material may be deposited to a thickness of between about 5 Å and about 500 Å, although any suitable material, deposition process, and thickness may be utilized. In a particular embodiment, the third metal comprising material may be formed using a chemical vapor deposition process. Any suitable process conditions may be utilized.

Once the opening left behind by the removal of the dummy gate electrode 121 has been filled, the materials may be planarized in order to remove any material that is outside of the opening left behind by the removal of the dummy gate electrode 121. In a particular embodiment the removal may be performed using a planarization process such as chemical mechanical polishing. However, any suitable planarization and removal process may be utilized.

FIG. 11A also illustrates that, once the gate electrode 1103 has been formed, silicide contacts 1105 and contacts 1107 may be formed through the ILD layer 701 to make electrical connection to the first epitaxial source/drain regions 601 and the second epitaxial source/drain region 603. In an embodiment the silicide contacts 1105 and the contacts 1107 may be formed by initially forming openings (not separately illustrated in FIG. 11A) through the ILD layer 701 in order to expose the first epitaxial source/drain regions 601 and the second epitaxial source/drain region 603. The openings may be formed using, e.g., a suitable photolithographic masking and etching process.

The silicide contacts 1105 may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contacts 1105 may be between about 5 nm and about 50 nm.

In an embodiment the contacts 1107 may be a conductive material such as Al, Cu, W, Co, Ti, Ta, Ru, TiN, TiAl, TiAlN, TaN, TaC, NiSi, CoSi, combinations of these, or the like, although any suitable material may be deposited into the openings using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP). However, any suitable material and process of formation may be utilized.

By forming and utilizing the first nanowires 901 and the second nanowires 1001 within the core region 102, high performance may be achieved with short channel devices, wherein the channel may be less than 100 nm. Additionally, by utilizing the embodiments described herein, the downsides of forming nanowires (e.g., a worse process window for the filling of the gate structure) may be avoided with long channel devices in the I/O region 104, wherein the channel may be greater than about 100 nm.

Figure 12:
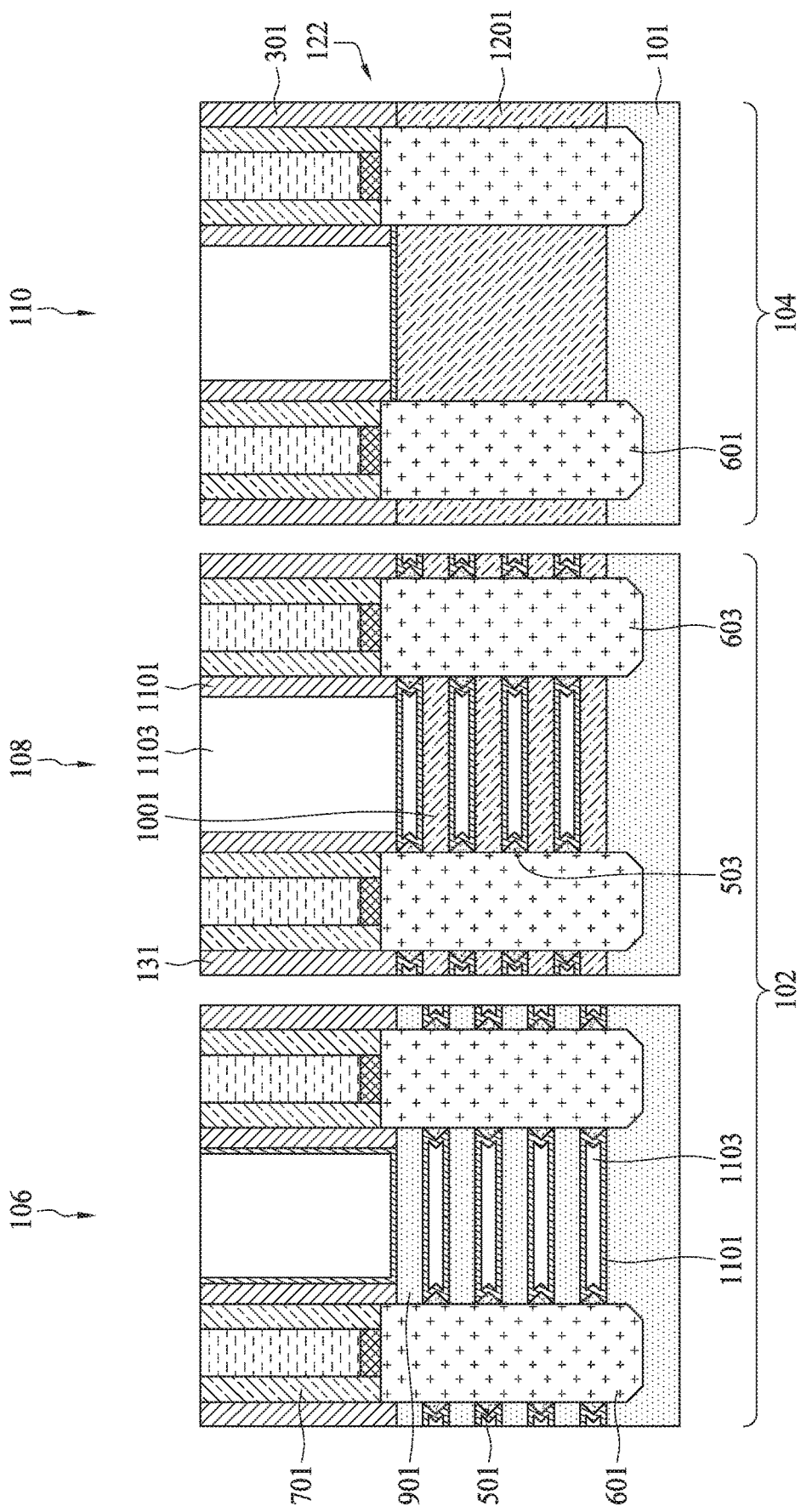
FIG. 12 illustrates a device which utilizes a single first material for a fin, in accordance with some embodiments.

FIG. 12 illustrates another embodiment in which, instead of the third device 110 comprising the stacked layer of alternating materials, utilizes a single material for the fin 122 within the third device 110. In this embodiment, prior to the deposition of the gate dielectric 1101, the eighth semiconductor layer 117, the seventh semiconductor layer 115, the sixth semiconductor layer 113, the fifth semiconductor layer 111, the fourth semiconductor layer 109, the third semiconductor layer 107, the second semiconductor layer 105, and the first semiconductor layer 103 may be removed using one or more etching processes after the first device 106 and the second device 108 are protected with, e.g., a protective material such as a photoresist.

Once the eighth semiconductor layer 117, the seventh semiconductor layer 115, the sixth semiconductor layer 113, the fifth semiconductor layer 111, the fourth semiconductor layer 109, the third semiconductor layer 107, the second semiconductor layer 105, and the first semiconductor layer 103 have been removed, the fin 122 may be regrown using a single material 1201. In an embodiment the single material may be a semiconductor material, such as silicon, silicon germanium, a III-V material, or the like, and may be doped either during formation or else doped afterwards in, e.g., an implantation process. Once the fin 122 has been regrown, the gate dielectric 1101 and the gate electrode 1103 may be formed as described above.

In an embodiment, a method of manufacturing a semiconductor device includes forming a first semiconductor layer over both a first region and a second region of a semiconductor substrate, the first semiconductor layer comprising a first material; forming a second semiconductor layer over the first region and the second region; removing the first semiconductor layer from over the first region to form a nanowire channel from the second semiconductor layer, wherein the removing the first semiconductor layer from over the first region does not remove the first semiconductor layer from over the second region; and forming a first gate electrode around the nanowire channel; and forming a second gate electrode over the first semiconductor layer and the second semiconductor layer in the second region. In an embodiment, the removing the first semiconductor layer is performed at least in part with a wet etching process. In an embodiment, the method includes forming a source/drain region adjacent to the second semiconductor layer prior to the removing the first semiconductor layer. In an embodiment, the method includes forming a spacer within the first semiconductor layer and between the second semiconductor layer and the semiconductor substrate prior to the removing the first semiconductor layer. In an embodiment, the first semiconductor layer and the second semiconductor layer in the second region form a semiconductor fin of a finFET. In an embodiment, the first semiconductor layer is silicon germanium. In an embodiment, the second semiconductor layer is silicon.

In an embodiment, a method of manufacturing a semiconductor device includes forming a first layer of silicon germanium over a silicon substrate; forming a first layer of silicon over the first layer of silicon germanium; patterning an opening through the first layer of silicon germanium and the first layer of silicon to separate the first layer of silicon germanium into a first region and a second region; forming a first recess within the first layer of silicon germanium after the patterning the opening through the first layer of silicon germanium; filling the first recess with a dielectric material; removing the first region of the first layer of silicon germanium without removing the second region of the first layer of silicon germanium; and simultaneously forming a first dielectric material around the first region of the first layer of silicon and a second dielectric material over both the second region of the first layer of silicon germanium and the first layer of silicon. In an embodiment, the method includes forming a first dummy gate dielectric over the first layer of silicon germanium; and forming a second dummy gate dielectric over the first layer of silicon germanium. In an embodiment, the method includes removing the first dummy gate dielectric adjacent to the first region of the first layer of silicon germanium without removing the second dummy gate dielectric. In an embodiment, the method includes forming a first gate electrode around the first layer of silicon; and forming a second gate electrode over both the second region of the first layer of silicon germanium and the first layer of silicon. In an embodiment, the forming the first gate electrode and the forming the second gate electrode are performed simultaneously. In an embodiment, the second region of the first layer of silicon germanium is located within an I/O region. In an embodiment, the first dielectric material around the first layer of silicon is located within a core region.

In an embodiment, a semiconductor device includes a semiconductor substrate with a core region and an I/O region; a first nanowire over a second nanowire located within the core region; a first inner spacer separating the first nanowire from the second nanowire; a gate material located between the first nanowire and the second nanowire; a channel located within the I/O region, wherein the channel includes a first material located in a first plane with the first nanowire, wherein the first nanowire comprises the first material; and a second material located in a second plane with the gate material, the first plane being parallel with the second plane, the second material being different from the first material. In an embodiment, the device includes a third nanowire over a fourth nanowire within the core region, the third nanowire and the fourth nanowire being located in the second plane and comprising the second material. In an embodiment, the first material is silicon. In an embodiment, the second material is silicon germanium. In an embodiment, the first inner spacer comprises silicon nitride. In an embodiment, the first inner spacer has a thickness that decreases in a first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate with a first region and a second region;
   a first nanowire and a second nanowire that are disposed over the first region of the substrate, the first nanowire extending further from the substrate than the second nanowire;
   a gate material between the first nanowire and the second nanowire;
   a channel over the second region of the substrate, wherein the channel comprises:
      a first material located in a first plane with the first nanowire, wherein the first nanowire comprises the first material; and
      a second material located in a second plane with the gate material, the second material being different from the first material.

2. The semiconductor device of claim 1, further comprising a gate dielectric material in the first region and in the second region, wherein the gate dielectric material in the first region is disposed around the first nanowire and the second nanowire.

3. The semiconductor device of claim 2, wherein the gate dielectric material in the second region is disposed along an upper surface of the channel distal to the substrate.

4. The semiconductor device of claim 1, further comprising a first source/drain region and a second source/drain region in the first region of the substrate, wherein the first nanowire and the second nanowire are between the first source/drain region and the second source/drain region.

5. The semiconductor device of claim 4, further comprising a gate dielectric material between the gate material and the first nanowire, and between the gate material and the second nanowire.

6. The semiconductor device of claim 5, further comprising an inner spacer between the first nanowire and the second nanowire, and between the first source/drain region and the gate dielectric material, wherein a first end of the inner spacer contacts the first source/drain region, and a second opposing end of the inner spacer contacts the gate dielectric material.

7. The semiconductor device of claim 6, wherein the inner spacer has an upper surface and a lower surface that are disposed between the first end and the second opposing end of the inner spacer, wherein a distance between the upper surface and the lower surface of the inner spacer decreases as the inner spacer extends away from the first source/drain region.

8. The semiconductor device of claim 4, further comprising:
   a third source/drain region and a fourth source/drain region disposed in the first region; and
   a third nanowire between the third source/drain region and the fourth source/drain region, wherein the third nanowire comprises the second material and is located in the second plane with the second material of the channel.

9. The semiconductor device of claim 8, further comprising a gate dielectric material, wherein the gate dielectric material is disposed around the first nanowire, the second nanowire, and the third nanowire.

10. The semiconductor device of claim 1, wherein the first material is silicon, and the second material is silicon germanium.

11. A semiconductor device comprising:
- a first source/drain region and a second source/drain region over a substrate;
- a first nanowire and a second nanowire that are disposed between the first source/drain region and the second source/drain region, the first nanowire is further from the substrate than the second nanowire;
- a gate dielectric material around the first nanowire and the second nanowire, wherein the gate dielectric material extends continuously from the first nanowire to the second nanowire;
- a gate material between the first nanowire and the second nanowire, wherein the gate dielectric material is between the gate material and the first nanowire and between the gate material and the second nanowire; and
- an inner spacer between the first nanowire and the second nanowire and between the gate dielectric material and the first source/drain region.

12. The semiconductor device of claim 11, wherein the inner spacer has a k-value smaller than that of the gate dielectric material.

13. The semiconductor device of claim 11, wherein the gate dielectric material contacts the inner spacer and the gate material.

14. The semiconductor device of claim 11, wherein the inner spacer has a first surface extending along and contacting the first source/drain region, a second surface facing the first nanowire, and a third surface facing the second nanowire, wherein the second surface intersects the third surface.

15. The semiconductor device of claim 14, wherein a distance between the second surface and the third surface of the inner spacer decreases as the inner spacer extends away from the first source/drain region.

16. The semiconductor device of claim 11, further comprising:
- a third source/drain region and a fourth source/drain region; and
- a channel region between the third source/drain region and the fourth source/drain region, wherein the channel region comprises alternating layers of a first semiconductor material and a second semiconductor material, wherein the first nanowire and the second nanowire comprise the second semiconductor material.

17. The semiconductor device of claim 16, further comprising a gate electrode over the channel region.

18. A method of manufacturing a semiconductor device, the method comprising:
- forming a stack of semiconductor materials over a substrate, the stack of semiconductor materials comprising alternating layers of a first semiconductor material and a second semiconductor material;
- forming first recesses into the stack of semiconductor materials, the first recesses exposing sidewalls of the first semiconductor material and sidewalls of the second semiconductor material;
- replacing end portions of the first semiconductor material exposed by the first recesses with a dielectric material;
- forming source/drain regions in the first recesses after the replacing; and
- selectively removing the first semiconductor material from the stack of semiconductor materials after forming the source/drain regions.

19. The method of claim 18, wherein replacing end portions of the first semiconductor material comprises:
- removing the end portions of the first semiconductor material exposed by the first recesses by performing a wet etch process using an etchant selective to the first semiconductor material, the wet etch process forming second recesses in the first semiconductor material;
- after removing the end portions of the first semiconductor material, lining sidewalls and bottoms of the first recesses with the dielectric material, the dielectric material filling the second recesses; and
- performing an anisotropic etching process to remove first portions of the dielectric material, second portions of the dielectric material in the second recesses remaining after the anisotropic etching process.

20. The method of claim 18, wherein after selectively removing the first semiconductor material, the second semiconductor material between the source/drain regions form nano-structures, wherein the method further comprises:
- forming a gate dielectric material around the nano-structures; and
- filling gaps between the nano-structures with a gate material.

* * * * *